(12) United States Patent
Park et al.

(10) Patent No.: US 10,784,320 B2
(45) Date of Patent: Sep. 22, 2020

(54) ORGANIC LIGHT-EMITTING DISPLAY DEVICE AND METHOD OF MANUFACTURING THE SAME

(71) Applicant: LG Display Co., Ltd., Seoul (KR)

(72) Inventors: Min-Hyung Park, Gunpo-si (KR); Jin-Ho Park, Goyang-si (KR); Ki-Min Lim, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 94 days.

(21) Appl. No.: 15/837,331

(22) Filed: Dec. 11, 2017

(65) Prior Publication Data

US 2018/0190738 A1 Jul. 5, 2018

(30) Foreign Application Priority Data

Dec. 30, 2016 (KR) .................. 10-2016-0184399

(51) Int. Cl.
*H01L 27/32* (2006.01)
*H01L 51/50* (2006.01)
*H01L 51/52* (2006.01)
*H01L 51/00* (2006.01)

(52) U.S. Cl.
CPC ...... *H01L 27/3246* (2013.01); *H01L 27/3209* (2013.01); *H01L 27/3211* (2013.01); *H01L 27/3276* (2013.01); *H01L 27/3283* (2013.01); *H01L 27/3288* (2013.01); *H01L 51/5056* (2013.01); *H01L 51/5203* (2013.01); *H01L 51/0014* (2013.01); *H01L 51/0026* (2013.01)

(58) Field of Classification Search
CPC ............. H01L 27/3246; H01L 27/3209; H01L 27/3276; H01L 27/3283

USPC ........................................................... 345/76
See application file for complete search history.

(56) References Cited

U.S. PATENT DOCUMENTS

| | | | |
|---|---|---|---|
| 2006/0017375 A1 | 1/2006 | Noguchi et al. | |
| 2011/0266535 A1 | 11/2011 | Li et al. | |
| 2014/0042400 A1* | 2/2014 | Kim | ...................... H01L 51/102 257/40 |
| 2014/0353606 A1* | 12/2014 | Choi | .................... H01L 51/5228 257/40 |
| 2016/0118449 A1* | 4/2016 | Sato | .................... H01L 27/3246 257/89 |

FOREIGN PATENT DOCUMENTS

| | | |
|---|---|---|
| JP | 2006-059796 A | 3/2006 |
| JP | 2009-283396 A | 12/2009 |
| JP | 2014-016549 A | 1/2014 |
| JP | 2014-053236 A | 3/2014 |

(Continued)

OTHER PUBLICATIONS

Extended European Search Report issued in counterpart European Patent Application No. 172040941 dated May 25, 2018.

(Continued)

*Primary Examiner* — Fred Tzeng
(74) *Attorney, Agent, or Firm* — Morgan, Lewis & Bockius LLP

(57) ABSTRACT

Disclosed are an organic light-emitting display device and a method of manufacturing the same, which prevent lateral current leakage by providing a bank with a metal pattern so as to realize electrical separation of a common layer formed thereon.

18 Claims, 20 Drawing Sheets

(56) References Cited

FOREIGN PATENT DOCUMENTS

| JP | 2016-085913 A | 5/2016 |
|---|---|---|
| KR | 10-2011-0138787 A | 12/2011 |
| TW | 2010-41430 A | 11/2010 |

OTHER PUBLICATIONS

Office Action issued in counterpart Japanese Patent Application No. 2017-247212 dated Jan. 15, 2019 (see partial English translation).
Office Action issued in counterpart Taiwanese Patent Application No. 106142769 dated Sep. 11, 2018.

* cited by examiner

ORGANIC LIGHT-EMITTING DISPLAY DEVICE AND METHOD OF MANUFACTURING THE SAME

This application claims the benefit of Korean Patent Application No. 10-2016-0184399, filed on Dec. 30, 2016, which is hereby incorporated by reference as if fully set forth herein.

BACKGROUND

Technical Field

The present disclosure relates to an organic light-emitting display device, and more particularly, to an organic light-emitting display device and a method of manufacturing the same, which may prevent lateral current leakage by providing a bank with a metal pattern so as to realize electrical separation of a common layer formed thereon.

Discussion of the Related Art

Recently, as the information age has fully arrived, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered a competitive application because it does not require a separate light source and enables realization of a compact device design and vivid color display.

The organic light-emitting display device includes organic light-emitting elements, which are independently driven on a per-sub-pixel basis. Such an organic light-emitting element includes an anode, a cathode, and a plurality of organic layers between the anode and the cathode.

The organic layers include a hole injection layer, a hole transport layer, an organic light-emitting layer, and an electron transport layer, which are sequentially disposed from the anode side. Among these, the organic light-emitting layer substantially functions to emit light as the energy of excitons, produced via the combination of holes and electrons, falls down to the ground state. The other layers function to assist in the transport of holes or electrons to the organic light-emitting layer.

In addition, in the organic light-emitting display device, for color display, sub-pixels are divided into red, green, and blue sub-pixels, and on a per-sub-pixel basis, an organic light-emitting layer having the color of a corresponding sub-pixel is formed. Generally, deposition using a shadow mask is used to form the organic light-emitting layer.

However, when the shadow mask has a large area, the shadow mask may droop due to the weight thereof, and thus may cause deterioration in a yield rate when used multiple times. Therefore, the other organic layers excluding the light-emitting layer are continuously formed in common in the respective sub-pixels without the shadow mask.

However, since current may flow laterally through the resulting common layer of the sub-pixels that is continuously formed in a plane, lateral current leakage may occur.

FIG. 1 is a cross-sectional view illustrating a lateral current leakage phenomenon in a related art organic light-emitting display device.

Considering one form of the related art organic light-emitting display device, as illustrated in FIG. 1, in each sub-pixel on a substrate 10, a first electrode 11, a bank 12, which is superimposed on the edge of the first electrode 11 and defines an emission portion, and a hole injection layer 13 and a hole transport layer 14, which cover the first electrode 11 and the bank 12, are formed in sequence. In addition, light-emitting layers 16 and 17, an electron transport layer 18, and a second electrode 19 are formed thereabove in sequence.

In addition, in a red sub-pixel having a light-emitting area that is located higher than those of other sub-pixels in an area between the first and second electrodes 11 and 19 according to resonance conditions, in order to match such a light-emitting height, an auxiliary hole transport layer 15 may be further provided between the hole transport layer 14 and the red light-emitting layer 16. The position of a light-emitting layer at which the maximum wavelength is obtained may be differently set between the first and second electrodes 11 and 19 for each color of light. A red light-emitting layer may be located at the highest height, a green light-emitting layer may be located at the second highest height, and a blue light-emitting layer may be located at the lowest height. Accordingly, a green sub-pixel may further include an auxiliary hole transport layer between the hole transport layer and the green light-emitting layer, and the auxiliary hole transport layer provided in the green sub-pixel may be thinner than the auxiliary hole transport layer 15 provided in the red sub-pixel.

However, as illustrated in FIG. 1, in the related art organic light-emitting display device, upon low-gradation blue illumination, a phenomenon in which an adjacent red sub-pixel is also turned on occurs. This represents a phenomenon in which, although a voltage is applied to a blue sub-pixel in order to emit pure blue light, current, which flows through a vertical electric field between an anode and a cathode of the blue sub-pixel, which is turned on, leaks laterally through a common layer, causing an adjacent sub-pixel to be turned on.

The lateral current leakage, in particular, is clearly visible in a low-gradation display. This is because, when current, which horizontally flows in the blue sub-pixel, flows laterally to common organic layers, the adjacent red sub-pixel, which is in an off state, acts as if it were turned on. In this case, color purity may be deteriorated, and the display of pure blue gradation is difficult.

This is because the drive voltage required for red illumination is lower than the drive voltage required for blue illumination, and therefore, causes a similar illumination effect even by a small amount of leaked current.

In particular, such other color illumination caused by lateral current leakage may cause color mixing in a low-gradation display, which may prevent a desired color from being normally displayed.

In addition, the lateral current leakage may have a greater effect on the adjacent sub-pixel when the hole mobility of the common organic layer is increased.

SUMMARY

Accordingly, embodiments of the present disclosure are directed to an organic light-emitting display device and a method of manufacturing the same that substantially obviate one or more of the problems due to limitations and disadvantages of the related art.

An aspect of the present disclosure is to provide an organic light-emitting display device and a method of manufacturing the same, which may prevent lateral current leakage by providing a bank with a metal pattern so as to realize electrical separation of a common layer formed thereon.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

An organic light-emitting display device of the present disclosure may include a metal pattern on a bank in order to remove an organic common layer, which may cause lateral current leakage, by heating the metal pattern via current application thereto, or may prevent lateral current leakage by applying a constant voltage to the metal pattern below the organic common layer.

To achieve these and other aspects of the inventive concepts, as embodied and broadly described, an organic light-emitting display device comprises a substrate including a plurality of sub-pixels each having an emission portion and a non-emission portion surrounding the emission portion, a first electrode on the emission portion of each of the sub-pixels, a bank on the non-emission portion, a metal pattern on a predetermined portion of the bank, an organic stack on the bank including the metal pattern and the emission portion, and a second electrode on the organic stack.

Here, the metal pattern may be located on an upper surface of the bank.

The organic stack located on an upper surface of the metal pattern may have a smaller thickness than that of the organic stack located on the emission portion.

Alternatively, the organic stack located on an upper surface of the metal pattern may have a smaller thickness than that of the organic stack on the bank having no metal pattern.

In addition, the organic stack may include a hole injection layer, a hole transport layer, a light-emitting layer, and an electron transport layer, and the hole injection layer, the hole transport layer, and the electron transport layer may be provided in common on all of the sub-pixels.

Alternatively, the organic stack may include a hole injection layer, two or more stacks each including a hole transport layer, a light-emitting layer, and an electron transport layer, and at least one charge generation layer between neighboring stacks, and the hole injection layer, the stacks, and the charge generation layer may be provided in common on all of the sub-pixels.

The metal pattern may be in direct contact with the hole transport layer of the organic stack.

In addition, the metal pattern may be elongated in one direction of the substrate and is connected to a current application unit on an edge of the substrate.

The metal pattern may be elongated in one direction of the substrate and is connected to a ground unit or a constant voltage application unit on an edge of the substrate.

Meanwhile, the bank may include first and second layers, and the metal pattern may be on a portion of an upper surface of the first layer.

Here, the second layer may be formed around the metal pattern and has the same height as the metal pattern.

Alternatively, the second layer may have a greater height than that of the metal pattern, and may have a bank hole configured to expose a portion of the metal pattern.

In addition, the bank hole may be discontinuously located on the metal pattern.

In addition, the organic stack on the metal pattern and the organic stack on the emission portion may have the same structure.

In another aspect, a method of manufacturing an organic light-emitting display device comprises preparing a substrate including a plurality of sub-pixels each having an emission portion and a non-emission portion surrounding the emission portion, providing a first electrode on the emission portion of each of the sub-pixels, providing a bank on the non-emission portion, providing a metal pattern on a predetermined portion of the bank, depositing a first organic layer on the bank, the metal pattern and the emission portion, removing the first organic layer on the metal pattern by supplying current to the metal pattern, depositing a second organic layer on the bank, the exposed metal pattern and the emission portion, and providing a second electrode on the second organic layer.

In this case, the removing may be performed by applying current to opposite ends of the metal pattern.

In addition, in accordance with a further embodiment of the present disclosure, a method of manufacturing an organic light-emitting display device, includes preparing a substrate including a plurality of sub-pixels each having an emission portion and a non-emission portion surrounding the emission portion, providing a first electrode on the emission portion of each of the sub-pixels, providing a first bank layer on the non-emission portion, providing a metal pattern on a predetermined portion of the first bank layer, the metal pattern being connected to a ground unit or a constant voltage application unit, providing a second bank layer on the first bank layer so as to form a bank, depositing an organic stack on the bank and the emission portion, and providing a second electrode on the organic stack.

Here, the providing the second bank layer may further include flattening the second bank layer so that the second bank layer remains only around the metal pattern so as to have the same height as the metal pattern on the first bank layer.

In addition, the providing the second bank layer may include forming the second bank layer so as to cover the metal pattern, and forming a bank hole configured to expose a portion of the metal pattern. In the depositing, the organic stack may be on the emission portion, on a top of the second bank layer, and on a top of the metal pattern.

It is to be understood that both the foregoing general description and the following detailed description are exemplary and explanatory and are intended to provide further explanation of the inventive concepts as claimed.

BRIEF DESCRIPTION OF THE DRAWINGS accompanying drawings, which are included to provide a further understanding of the disclosure and are incorporated and constitute a part of this application, illustrate embodiments of the disclosure and together with the description serve to explain various principles.

Figure 15A:
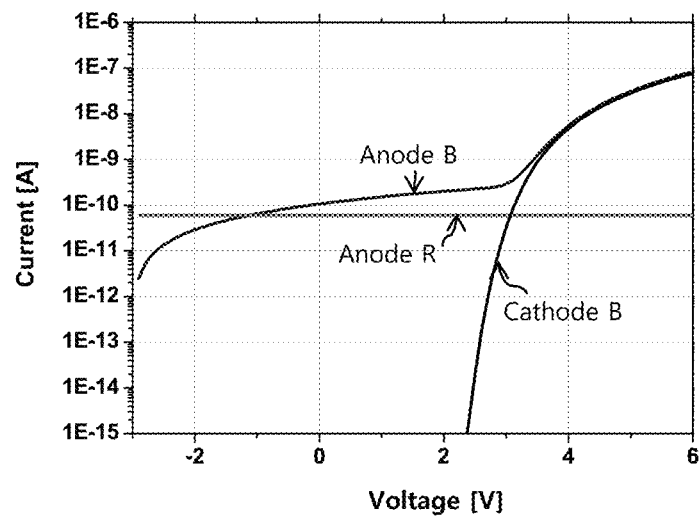
Figure 15B:
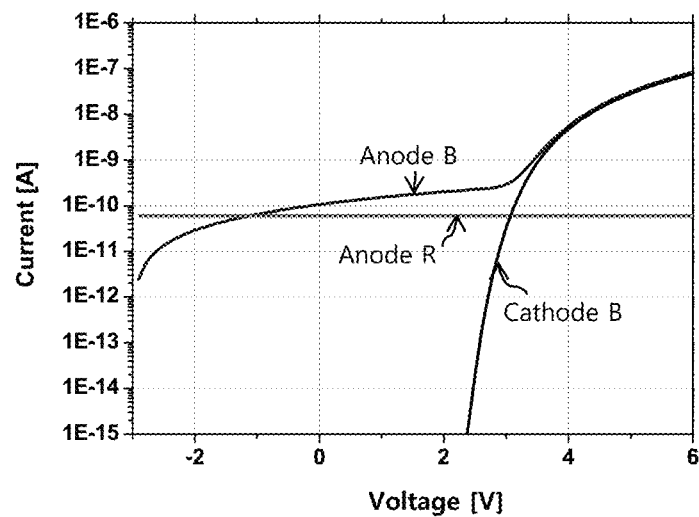

FIGS. 15A and 15B are graphs illustrating the measurement of current of each electrode in the case where zero voltage is applied to a first electrode (anode) of a red sub-pixel adjacent to a blue sub-pixel and in the case where the first electrode is in a floating state with respect to the organic light-emitting display devices according to the second embodiment and the third embodiment of the present disclosure.

DETAILED DESCRIPTION

The advantages and features of embodiments of the present disclosure and ways of attaining them will become apparent with reference to embodiments described below in detail in conjunction with the accompanying drawings. The present invention, however, are not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

In the drawings for explaining the exemplary embodiments of the present invention, for example, the illustrated shape, size, ratio, angle, and number are given by way of example, and thus, are not limited to the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises," "includes," and/or "has", used in this specification, do not preclude the presence or addition of other elements unless it is used along with the term "only". The singular forms "a," "an," and "the" are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts may be located between the two parts unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession unless the term "directly" or "just" is used.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkage and driving thereof are possible. These various embodiments may be performed independently of each other, or may be performed in association with each other.

In this specification, a stack means a unit structure that includes organic layers such as a hole transport layer and an electron transport layer and an organic light-emitting layer interposed between the hole transport layer and the electron transport layer. The organic layers may further include a hole injection layer, an electron blocking layer, a hole blocking layer, and an electron injection layer, and may further include other organic layers according to the structure or design of an organic light-emitting element.

The following description is given for respective embodiments. All embodiments have a common structure in which a bank is provided with a metal pattern. In addition, the embodiments have a common effect of eliminating lateral current leakage, caused by an organic common layer deposited on the bank, through the provision of the metal pattern.

First Embodiment

Figure 1:
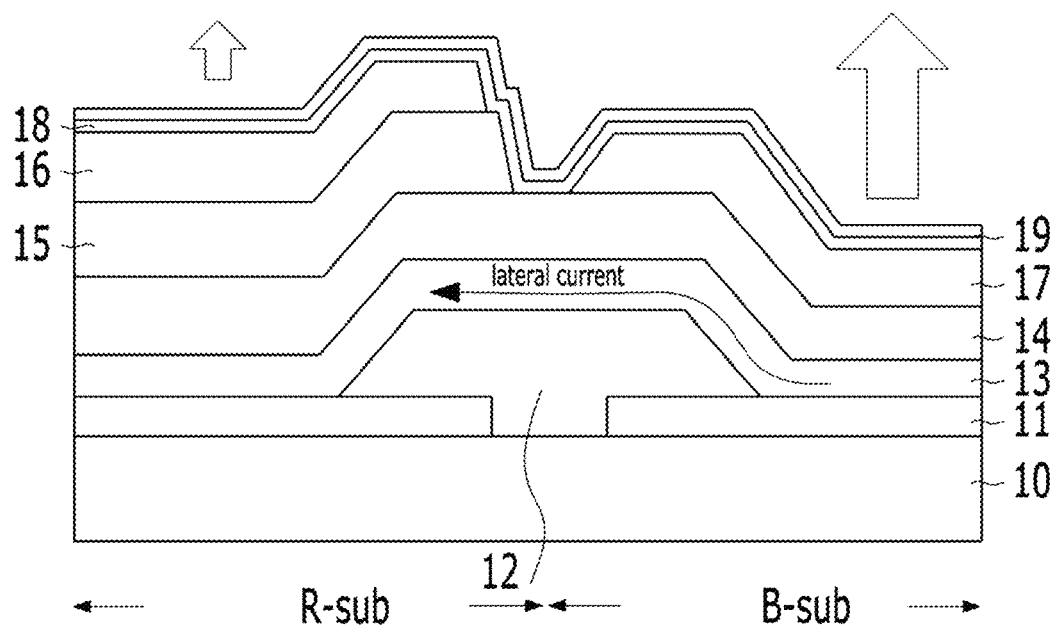
FIG. 1 is a cross-sectional view illustrating a lateral current leakage phenomenon in a related art organic light-emitting display panel.
Figure 2:
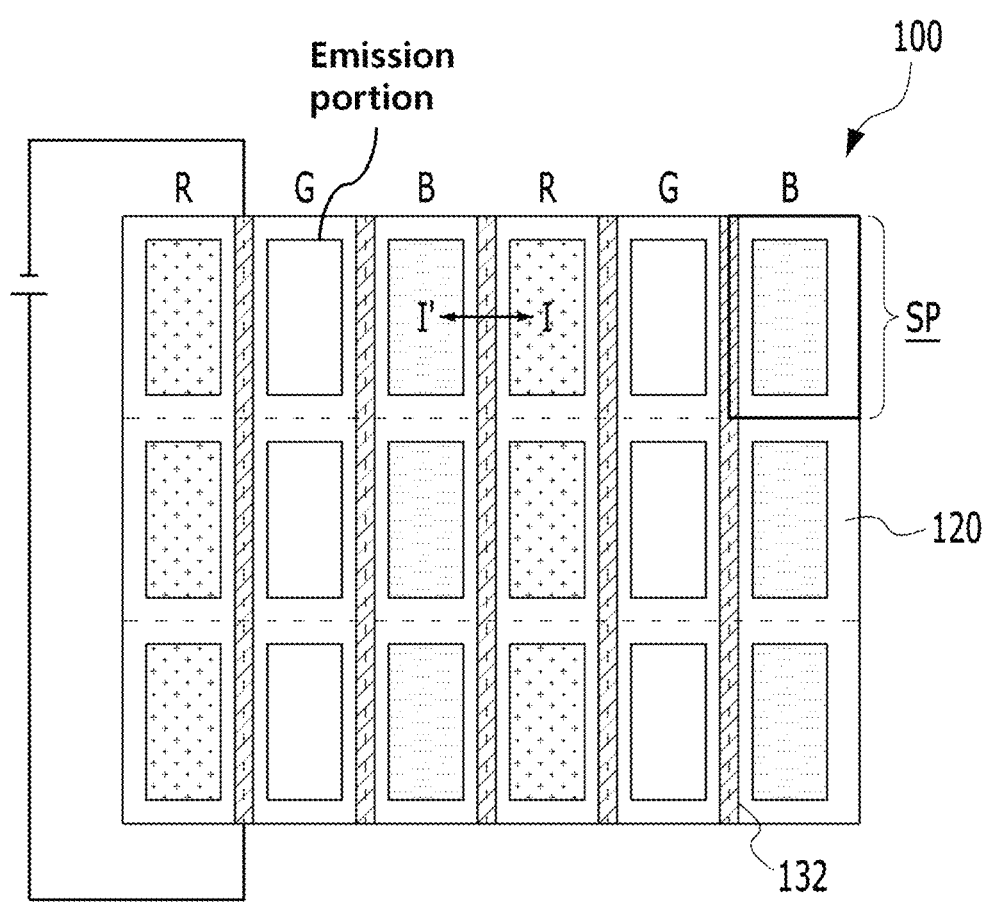
FIG. 2 is a plan view illustrating an organic light-emitting display device according to a first embodiment of the present disclosure.
Figure 3:
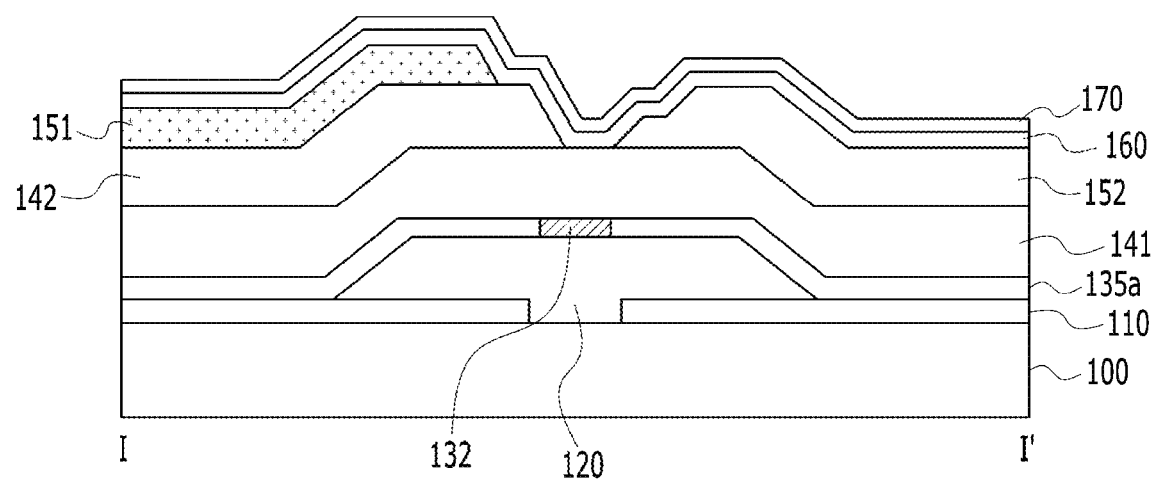
FIG. 3 is a cross-sectional view taken along line I-I' of FIG. 2.

FIG. 2 is a plan view illustrating an organic light-emitting display device according to a first embodiment of the present invention, and FIG. 3 is a cross-sectional view taken along line I-I' of FIG. 2.

As illustrated in FIGS. 2 and 3, the organic light-emitting display device according to the first embodiment of the present invention includes a substrate 100 having a plurality of sub-pixels SP each having an emission portion and a non-emission portion surrounding the emission portion, a first electrode 110 provided on the emission portion of each sub-pixel SP, a bank 120 provided on the non-emission portion, a metal pattern 132 provided on a predetermined portion of the bank 120, and an organic common layer such as a hole injection layer 135a provided on the emission portion and on the bank 120, excluding the predetermined portion of the bank 120, on which the metal pattern 132 is provided. In the following, the organic common layer 135a may be referred to as a hole injection layer. However, it will be understood that a hole injection layer is only an example of the organic layer 135a. The organic common layer 135a may adjoin the metal pattern 132. The organic common layer 135a may not overlap the metal pattern 132.

In addition, in the emission portion, a second electrode 170 is provided on an organic stack including a hole transport layer 141, light-emitting layers 151 and 152, and an electron transport layer 160.

The substrate 100 may be a glass substrate or a flexible film.

The first electrode 110 may be disposed under the bank 120 and may be formed on the emission portion so that a portion thereof may enter the non-emission portion. That is, as illustrated, the bank 120 and the first electrode 110 may overlap each other.

The bank 120 defines the boundary of the emission portion and the non-emission portion. The organic stack is formed in a flat form in the area opened by the bank 120 so as to define the emission portion of each sub-pixel SP. Light is emitted from the light-emitting layers 151 and 152 of the organic stack provided on the emission portion.

The thickness of the bank 120 is substantially within a range from approximately 1 μm to 5 μm, and is greater than the total thickness of the organic stack provided between the first electrode 110 and the second electrode 170. Thus, since organic matter exhibits strong smoothness upon deposition, the organic stack may be deposited on the lateral surface of the bank 120 at a smaller thickness than on the flat portion. However, in recent organic light-emitting display devices, in order to increase a process yield or to realize a tandem structure, organic layers are deposited in common on all sub-pixels without distinguishing between areas. At this time, since the organic layers are deposited on all sub-pixels including the emission portion without a deposition mask, the organic layers are formed on the upper surface of the bank 120 as well as the lateral surface of the bank 120, although there is a difference in thickness. Among various organic layers connected to one another, a highly conductive layer may cause lateral current leakage.

The organic light-emitting display device according to the first embodiment of the present invention may include the metal pattern 132 on a portion of the upper surface of the bank 120 in order to achieve disconnection of a hole injection layer 135 between the sub-pixels SP by burning the highly conductive hole injection layer 135 on the metal pattern 132 via current application to the metal pattern 132 under a high-temperature condition. That is, the patterned hole injection layer 135a is defined by removing the highly conductive hole injection layer 135 from the top of the metal pattern 132 without a mask, as will be described herein below in connection with FIGS. 4A-4D.

In this case, the metal pattern 132 is elongated in one direction (a column direction or a row direction) of the substrate 100 and current is supplied to opposite ends of the metal pattern 132. Since the metal pattern 132 is formed of a metal having high resistance, the metal pattern 132 generates Joule heat when current of a given amount or more is supplied thereto, thereby enabling the removal of the hole injection layer 135 thereon.

In the organic light-emitting display device according to the first embodiment of the present invention, the reason why the exemplary removal of the hole injection layer 135 is described is because the hole injection layer 135 is in direct contact with the first electrode (anode) 110 and is formed of a material having high hole conductivity such as a p-type dopant in order to reduce a barrier for the electrode for the injection of holes into the organic layer, and the material having high hole conductivity may easily cause lateral leakage current.

In some cases, when a highly conductive organic layer excluding the hole injection layer 135 is provided between the first and second electrodes 110 and 170, the organic layer may also be removed by applying Joule current to the metal pattern 132 (in other words, by applying electrical current so as to achieve Joule heating of the metal pattern 132). Thereby, after the hole injection layer 135 on the metal pattern 132 is removed via the application of Joule current, the hole transport layer 141 may come into contact with the metal pattern 132. In this case, the hole transport layer 141 has lower hole mobility than the hole injection layer, and thus does not cause serious lateral current leakage even if it is provided in common on all of the sub-pixels.

In the illustrated example, on the hole injection layer 135a that is patterned by applying Joule current to the metal pattern 132, the hole transport layer 141, the light-emitting layers 151 and 152, and the electron transport layer 160, which constitute the organic stack, may be formed in sequence.

Meanwhile, reference numeral 142 designates an auxiliary hole transport layer, which is provided to assist in the adjustment of an optical distance, for example, in a red sub-pixel in which the light-emitting layer 151 is located at a relatively high position between the first and second electrodes 110 and 170 in consideration of the wavelength of the color of light to be emitted. Although not illustrated in the cross section of FIG. 3, an auxiliary hole transport layer may further be provided on a green sub-pixel. The required thickness of the auxiliary hole transport layer may vary according to the wavelength, and in most cases, a sub-pixel having a longer-wavelength light-emitting layer requires a thicker auxiliary hole transport layer.

Meanwhile, although FIG. 3 illustrates an exemplary structure in which the light-emitting layers 151 and 152 are separately formed for each sub-pixel SP, in some cases, an organic stack capable of emitting white light may be provided between the first and second electrodes 110 and 170 and may be provided in common on all of the sub-pixels. In this case, the display of different colors may be achieved by applying different color filters to respective sub-pixels.

In the case where such an organic stack capable of emitting white light is provided, the organic light-emitting display device of the present invention may effectively adopt the structure of highly conductive common organic layers. In this case, the organic stack capable of emitting white light may be a stack including a hole injection layer HIL, a hole transport layer HTL, a light-emitting layer EML, and an electron transport layer ETL. Alternatively, the organic stack may include a hole injection layer HIL, multiple stacks, and a charge generation layer CGL between the neighboring stacks. Here, each of the multiple stacks may include a hole transport layer HTL, a light-emitting layer EML, and an electron transport layer ETL.

Figure 7:
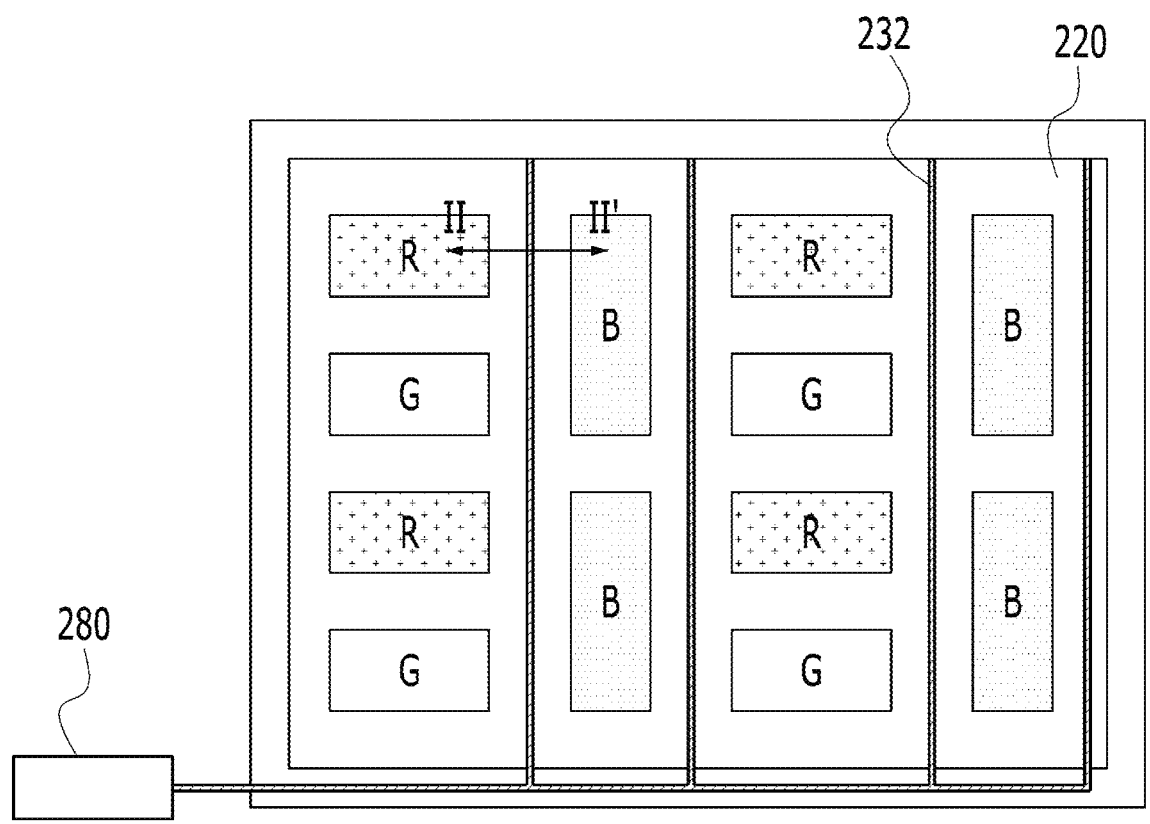
FIG. 7 is a plan view illustrating an organic light-emitting display device according to a second embodiment of the present disclosure.

Meanwhile, although FIG. 2 illustrates an exemplary arrangement in which a red sub-pixel R, a green sub-pixel G, and a blue sub-pixel B (e.g., a plurality of red sub-pixels arranged in a first column, a plurality of green sub-pixels arranged in a second column, and a plurality of blue sub-pixels arranged in a third column) are arranged parallel to one another in a stripe arrangement and the metal pattern 132 takes the form of a bar formed between the stripe-shaped sub-pixels (e.g., a first bar formed between the plurality of red sub-pixels arranged in the first column and the plurality of green sub-pixels arranged in the second column, and a second bar formed between the plurality of green sub-pixels arranged in the second column and the plurality of blue sub-pixels arranged in the third column), the present invention is not limited thereto. As in the example illustrated in FIG. 7, the red sub-pixel R and the green sub-pixel G may be alternately arranged in the vertical direction, and the blue sub-pixel B may be arranged parallel to a pair of red and green sub-pixels in the horizontal direction. The aforementioned vertical direction and horizontal direction may correspond to, respectively, a column direction and row direction of the display device. For example, a plurality of red and green sub-pixels R and G may be alternately arranged in a first column, and a plurality of blue sub-pixels B may be arranged in a second column next to the first column, wherein the location of a blue sub-pixel B corresponds to the location of a respective pair of red and green sub-pixels R and G, as shown in FIG. 7. This example serves to compensate for low blue light luminous efficacy.

In some cases, the metal pattern 132 may be formed along opposite sides of the blue sub-pixel when it is applied to the structure of FIG. 7. Since the risk of intentionally turning on an adjacent sub-pixel is the highest when the blue sub-pixel is turned on, the above-described structure may prevent an adjacent sub-pixel from being turned on due to lateral current leakage.

Hereinafter, a method of manufacturing the organic light-emitting display device according to the first embodiment of the present invention will be described.

FIGS. 4A to 4D are process cross-sectional views illustrating a method of manufacturing the organic light-emitting display device according to the first embodiment of the present invention.

Figure 4A:
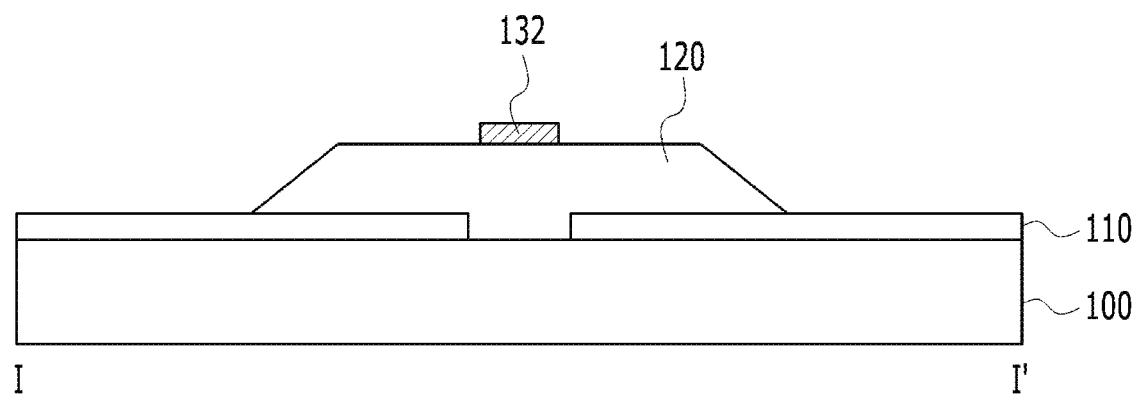
FIGS. 4A to 4D are process cross-sectional views illustrating a method of manufacturing the organic light-emitting display device according to the first embodiment of the present disclosure.

As illustrated in FIG. 4A, the first electrodes 110 of the sub-pixels are formed on the substrate 100.

The substrate 100 may be a glass substrate or a flexible substrate. Before the first electrode 110 is formed in each sub-pixel, a thin-film transistor array, which includes a driving thin-film transistor, a switching thin-film transistor, and a capacitor, may be provided under the first electrode 110. The thin-film transistor array will be understood by referring to a known circuit structure of 2T 1C or more for each sub-pixel, and thus a detailed description thereof will be omitted.

Here, the first electrode 110 may be formed so as to be connected to one electrode of the driving thin-film transistor. The first electrode 110 may be a transparent electrode or a reflective electrode, may be determined based on the work function and the light-emitting direction, and may be formed in a single layer or in multiple layers.

Subsequently, the bank 120 is formed so as to cover the edges of the first electrodes 110 of the adjacent sub-pixels. The area opened by the bank 120 is defined as the emission portion, and the area in which the bank 120 is located is defined as the non-emission portion.

Subsequently, the metal pattern 132 is formed on a portion of the upper surface of the bank 120.

The metal pattern 132 is elongated in a given direction of the substrate 100. This serves to connect a current application unit to opposite ends of the metal pattern 132 so as to apply current thereto. That is, the metal pattern 132 may extend in a given direction across the sub-pixels arranged on the substrate 100, and may extend to the edge (pad portion) of the substrate 100. FIG. 2 illustrates the metal pattern 132 having a vertically elongated shape (in other words, a shape elongated along a vertical direction (e.g., column direction of the display device)).

Figure 4B:
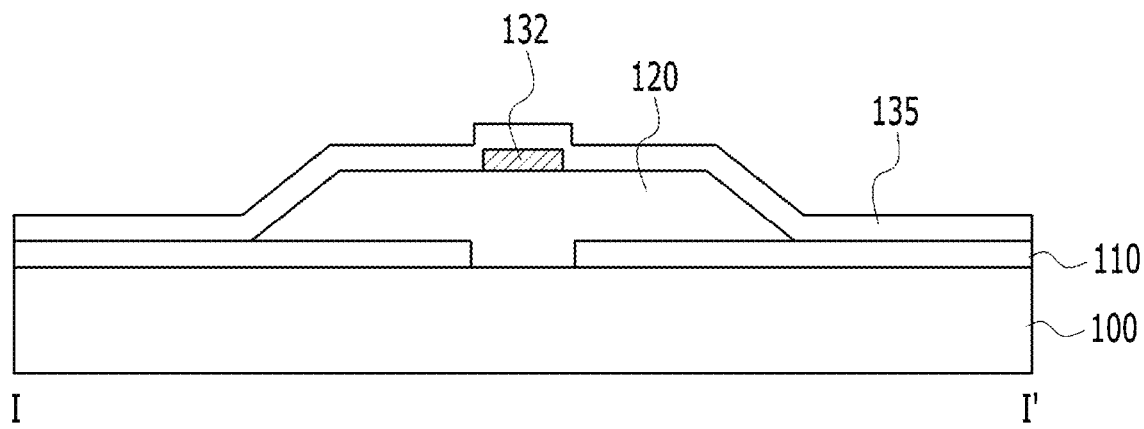

Subsequently, as illustrated in FIG. 4B, the hole injection layer 135 is formed on the substrate 100 including the metal pattern 132.

Here, the hole injection layer 135 is formed not only on the first electrode 110 included in the emission portion, but also on the bank 120 including the metal pattern 132. The hole injection layer 135 is formed on the flat upper surface and the lateral surface of the bank 120 on which no metal pattern 132 is formed, and is also formed on the upper surface and the lateral surface of the metal pattern 132. As such, the hole injection layer 135 is continuously formed between neighboring banks 120.

Figure 4C:
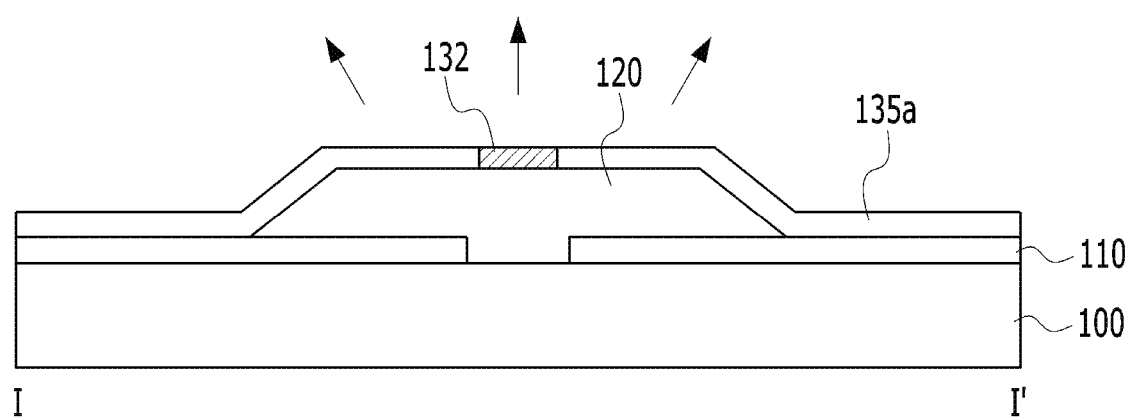

Subsequently, as illustrated in FIG. 4C, the metal pattern 132 is heated to a temperature of approximately 200° C. to 300° C. for a predeterminable time duration by applying different electrical potentials at opposite ends of the metal pattern 132, and thus driving an electrical current through the metal pattern 132 (Joule heating), so as to form the patterned hole injection layer 135a via sublimation of the hole injection layer on the metal pattern 132.

Figure 4D:
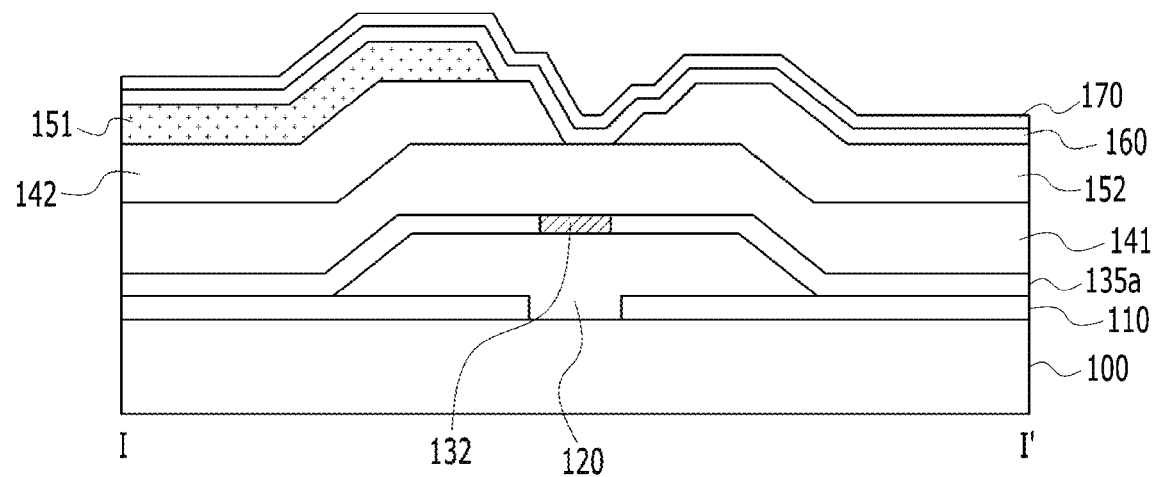

Subsequently, as illustrated in FIG. 4D, the organic stack is formed in the state where the metal pattern 132 is exposed. That is, the hole transport layer 141 is formed on the hole injection layer and the exposed metal pattern 132, and the auxiliary hole transport layer 142 is selectively formed on a particular sub-pixel. Then, the light-emitting layers 151 and 152 corresponding to the respective sub-pixels are formed, and then the electron transport layer 160 is formed in common, and finally the second electrode (cathode) 170 is formed.

Here, the organic matter of the organic stack may be formed via deposition, and the layers of the stack excluding the auxiliary hole transport layer 142 and the light-emitting layers 151 and 152 may be deposited in common on the sub-pixels without using a mask and without distinguishing between areas.

In addition, the second electrode 170 may be formed via deposition.

Meanwhile, by the hole injection layer 135a patterned in the process of FIG. 4C, among organic layers to be deposited later, the organic layers 141 and 160 on the metal pattern 132 may be thinner than the organic layers 135a, 141, 151 and 160 in the emission portion. In addition, the organic layers 141 and 160 on the metal pattern 132 may be thinner than the organic layers 135, 141, 151 and 160 on the portion of the bank 120 on which no metal pattern 132 is provided.

Here, the light-emitting layers 151 and 152 and the auxiliary hole transport layer 142 are formed as divided areas using a deposition mask. Although these layers are separately formed for each sub-pixel so as to correspond to the emission portion, the deposition is performed in the state in which the deposition mask is not attached to the substrate and the organic matter is in a gaseous phase. Therefore, although the organic matter may move slightly toward the top of the bank 120 during the deposition, this is not intentional.

After an organic light-emitting diode of each sub-pixel (i.e. the first electrode, the organic stack, and the second electrode) is formed as described above, the respective sub-pixels of the organic light-emitting display device are separated from highly conductive organic layers by the patterned hole injection layer 135a, which may prevent lateral current leakage. That is, the hole injection layer 135a is non-contiguous (in other words, interrupted) in the non-emission portion due to the metal pattern 132. As a result, a problem in which an adjacent sub-pixel is abnormally turned on when a particular sub-pixel is turned on may not occur.

Hereinafter, the experimentally checked result of reduction or elimination of lateral current leakage with regard to the manufacture of the organic light-emitting display device according to the first embodiment described above will be described.

Figure 5:
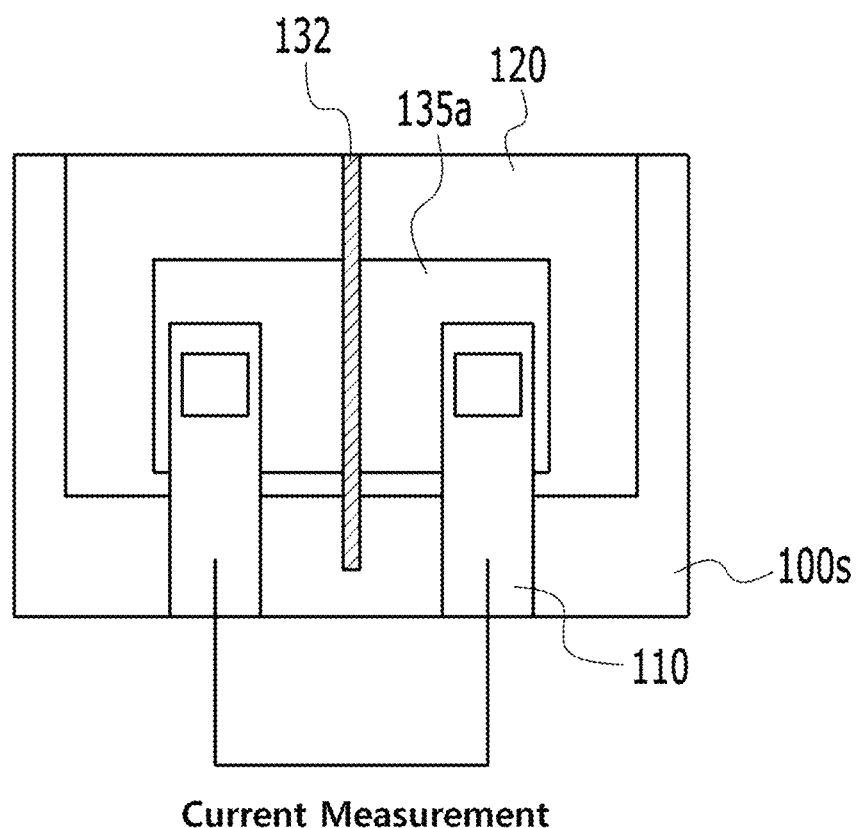
FIG. 5 is a view illustrating a test pattern for verifying the removal of a hole injection layer in the organic light-emitting display device according to the first embodiment of the present disclosure.
Figure 6:
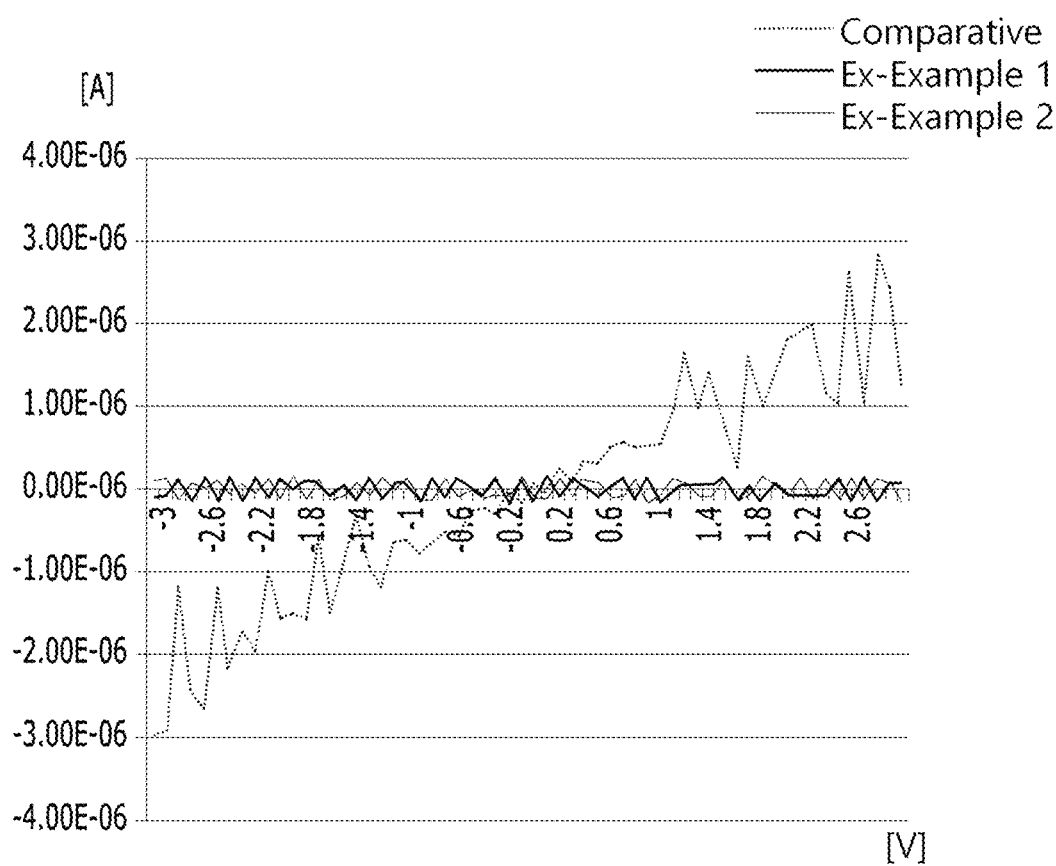
FIG. 6 is a graph illustrating current measured in the test pattern of FIG. 5 with respect to a comparative example and experimental examples.

FIG. 5 is a view illustrating a test pattern for verifying the removal of the hole injection layer in the organic light-emitting display device according to the first embodiment of the present invention, and FIG. 6 is a graph illustrating current measured in the test pattern of FIG. 5 with respect to a comparative example and experimental examples.

As illustrated in FIG. 5, in experimental examples 1 and 2 of the organic light-emitting display device according to the first embodiment of the present invention, two adjacent sub-pixels were provided on a sample substrate 100s, the first electrodes 110 were provided on the respective sub-pixels, and the bank 120 was formed to overlap the first electrodes 110. Then, after the metal pattern 132 is provided between the two first electrodes 110, a single hole injection layer including a p-type dopant in an amount of 5 wt % was formed to a thickness of 100 Å between both the first electrodes 110. Subsequently, after Joule heat of 300° C. is applied to the metal pattern 132 between the two first electrodes 110 for 3 minutes, current flowing to the first electrodes 110 was measured.

Here, the metal pattern 132 was formed of a metal such as Ag.

On the other hand, in a comparative example, current between the two first electrodes 110 was measured in the state in which the metal pattern 132 is omitted in the structure of FIG. 5.

As illustrated in FIG. 6, it can be found that the comparative example shows great variation in current as the time passes and both the experimental examples 1 and 2 show almost no variation in current. That is, it can be found that no lateral current leakage occurs when the organic light-emitting display device according to the first embodiment of the present invention is applied.

Meanwhile, although the first embodiment has been described as an example of removing the highly conductive organic layer or the hole injection layer that causes lateral current leakage, the present invention is not limited thereto, and a method of preventing lateral current leakage even when the highly conductive organic layer remains in the device will be described.

Second Embodiment

Figure 8:
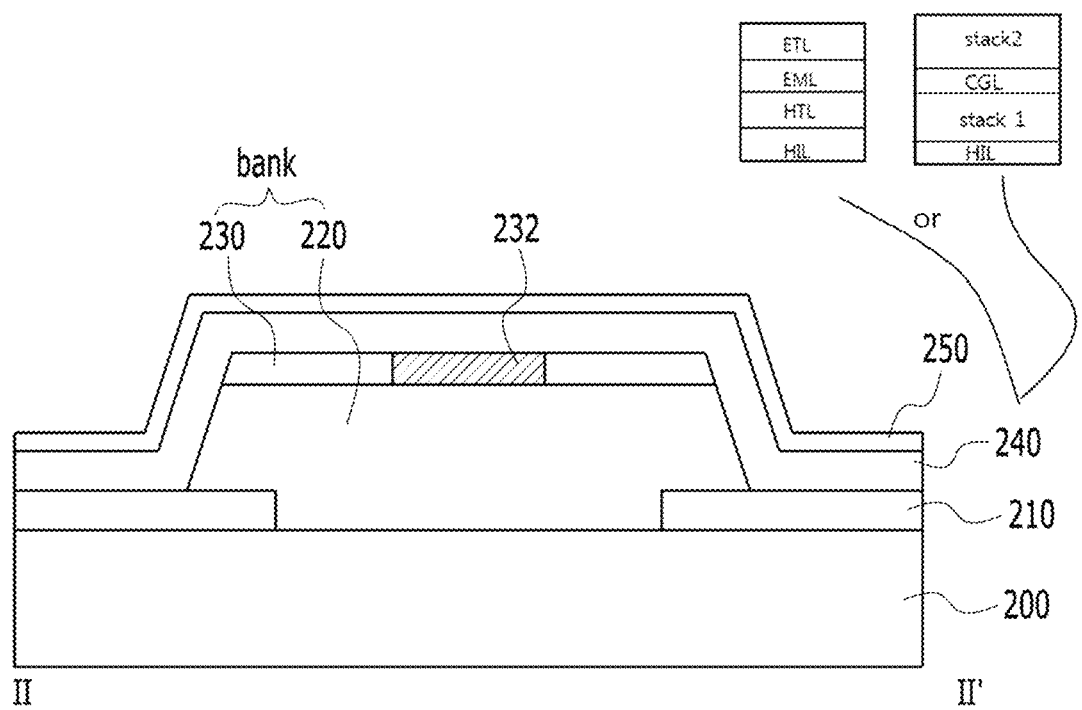
FIG. 8 is a cross-sectional view taken along line II-II' of FIG. 7.

FIG. 7 is a plan view illustrating an organic light-emitting display device according to a second embodiment of the present invention, and FIG. 8 is a cross-sectional view taken along line II-II' of FIG. 7.

As illustrated in FIGS. 7 and 8, the organic light-emitting display device according to the second embodiment of the present invention includes a substrate 200 having a plurality of sub-pixels SP each having an emission portion R, G or B and a non-emission portion surrounding the emission portion, a first electrode 210 provided on the emission portion of each sub-pixel, a bank provided on the non-emission portion, a metal pattern 232 provided on a predetermined portion of the bank, and an organic stack 240 provided on the bank including the metal pattern 232 and the emission portion.

Here, the bank includes first and second layers 220 and 230, and the metal pattern 232 is formed on a portion of the surface of the first layer 220.

The second layer 230 may be formed around the metal pattern 232 at the same height as the metal pattern 232. In this case, the metal pattern 232 and the bank including the first and second layers 220 and 230 integrally have a trapezoidal structure in a cross-section, so that the bank and the metal pattern 232 have a flat surface, which may secure good contactability with layers to be deposited thereon and good adhesive strength in a subsequent encapsulation process.

In addition, the organic stack 240 has a consistent structure on the metal pattern 232 and on the first electrode 210 in the emission portion. That is, as illustrated in FIG. 8, the organic stack 240 may be of a single stack type that includes a hole injection layer HIL, a hole transport layer HTL, a light-emitting layer EML, and an electron transport layer ETL, or may be of a multi-stack type that includes a hole injection layer HIL, a first stack, a charge generation layer CGL, and a second stack. In the latter case, the organic stack may include a greater number of stacks than the two stacks that are illustrated, and the charge generation layer may be provided between the neighboring stacks. For example, the charge generation layer may include an n-type charge generation layer and a p-type charge generation layer.

In some cases, in the organic stack 240, as in the structure described with reference to FIG. 3, a portion of the light-emitting layer or the hole transport layer may be separately formed for each sub-pixel.

The second embodiment has a difference from the first embodiment in that the hole injection layer, which is deposited on the metal pattern 232 so as to be in contact (e.g., in direct contact) therewith, is not removed and remains after the device is completed. Therefore, the organic stack 240, which is located on the flat upper surface of the bank or is located on the first electrode 210, may have the same structure as the organic stack 240 located on the metal pattern 232.

Here, the metal pattern 232 may be elongated in a given direction of the substrate 200 so as to be connected to a ground unit or a constant voltage application unit 280 provided on the edge of the substrate 200. Unlike the application of heat described above, the metal pattern 232 serves as the boundary for electrical disconnection between adjacent sub-pixels by causing the organic stack on the metal pattern 232 to be grounded or by applying a constant voltage to the organic stack when a ground voltage or the constant voltage is applied to the metal pattern 232.

Meanwhile, the plan view of FIG. 7 illustrates that the metal pattern 232 is formed along opposite sides of the blue sub-pixel. In some cases, a metal pattern may be further provided in the horizontal direction between the red sub-pixel and the green sub-pixel. Alternatively, as in the example of FIG. 2, the red sub-pixel R, the green sub-pixel G, and the blue sub-pixel B may be arranged parallel to one another in a stripe arrangement, and the metal pattern 232 may be formed between the stripe-shaped sub-pixels.

Figure 9:
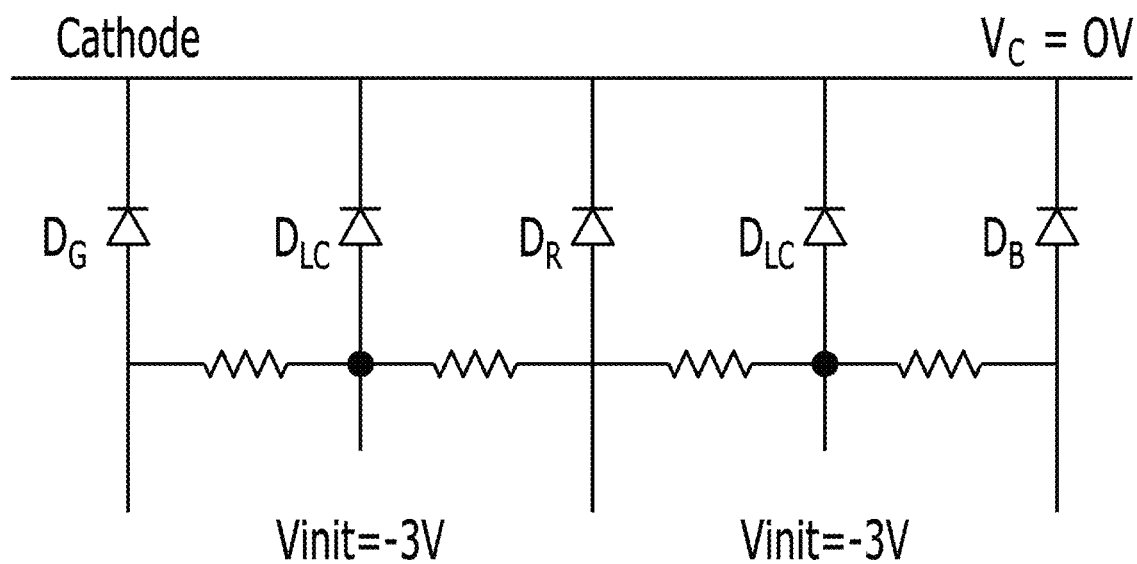
FIG. 9 is an equivalent circuit diagram of FIG. 7.

FIG. 9 is an equivalent circuit diagram of FIG. 7.

In FIG. 9, which illustrates the equivalent circuit diagram of the organic light-emitting display device according to the second embodiment of the present invention, $D_G$ designates the organic light-emitting diode of the green sub-pixel, $D_R$ designates the organic light-emitting diode of the red sub-pixel, $D_B$ designates the organic light-emitting diode of the blue sub-pixel, and $D_{LC}$ designates a parasitic diode generated by laterally leaked current.

In the circuit, resistance is interpreted as resistance generated due to the connection of layers.

The second embodiment of the present invention prevents laterally leaked current between adjacent sub-pixels from being transferred to the periphery of a node by applying a constant voltage Vinit to the node.

Although the example illustrates that the constant voltage Vinit is −3V, this is given by way of example and is not limiting, and may be changed to a ground voltage or another constant voltage.

Meanwhile, in FIG. 9, $V_c$ designates the voltage applied to the second electrode, and means that the second electrode is grounded to 0V.

Hereinafter, a method of manufacturing the organic light-emitting display device according to the second embodiment of the present invention will be described.

FIGS. 10A to 10E are process cross-sectional views illustrating a method of manufacturing the organic light-emitting display device according to the second embodiment of the present invention.

Figure 10A:
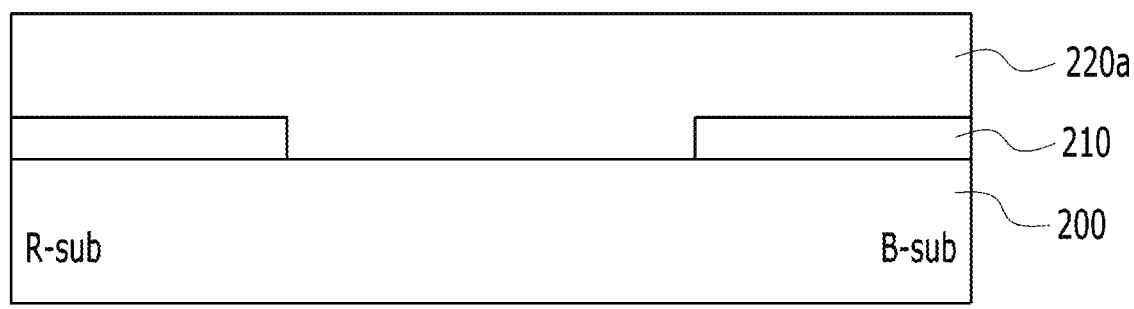
FIGS. 10A to 10E are process cross-sectional views illustrating a method of manufacturing the organic light-emitting display device according to the second embodiment of the present disclosure.

As illustrated in FIG. 10A, the first electrode 210 is formed on each sub-pixel R-sub, G-sub or B-sub of the substrate 200.

The substrate 200 may be a glass substrate or a flexible substrate. Before the first electrode 210 is formed, a thin-film transistor array, which includes a driving thin-film transistor, a switching thin-film transistor, and a capacitor, may be provided under the first electrode 210. The thin-film transistor array will be understood by referring to a known circuit structure of 2T1C or more for each sub-pixel, and thus a detailed description thereof will be omitted.

Here, the first electrode 210 may be formed so as to be connected to one electrode of the driving thin-film transistor. The first electrode 210 may be a transparent electrode or a reflective electrode, may be determined based on the work function and the light-emitting direction, and may be formed in a single layer or in multiple layers.

Subsequently, a first bank layer 220a is formed on the entire surface of the substrate 200 including the first electrode 210.

Figure 10B:
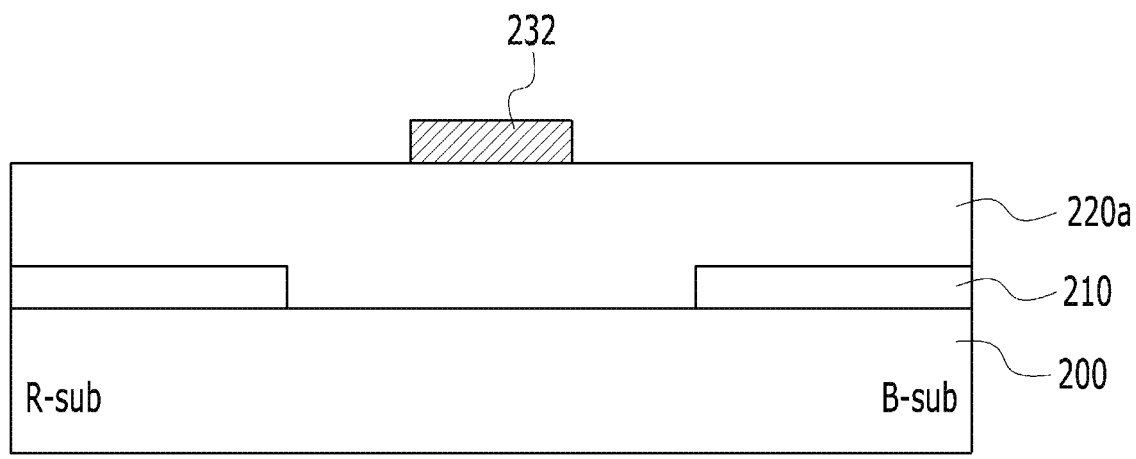

As illustrated in FIG. 10B, the metal pattern 232 is formed between the first electrodes 210 of the adjacent sub-pixels on the portion of the first bank layer 220a corresponding to the non-emission portion. That is, the metal pattern 232 is located between the first electrodes 210 of the adjacent sub-pixels in a plan view.

Here, the metal pattern 232 is elongated in a given direction of the substrate 200 and is connected at one side thereof to the ground unit or the constant voltage application unit 280 as illustrated in FIG. 7.

That is, the metal pattern 232 may extend in a given direction across the sub-pixels arranged on the substrate 200, and may extend to the edge (pad portion) of the substrate 200. FIG. 7 illustrates the metal pattern 232 having a vertically elongated shape (in other words, a shape elongated along a vertical direction (e.g., column direction of the display device)). In addition, multiple metal patterns 232 may be interconnected at the ends thereof so as to share a voltage applied from the ground unit or the constant voltage application unit 280.

Figure 10C:
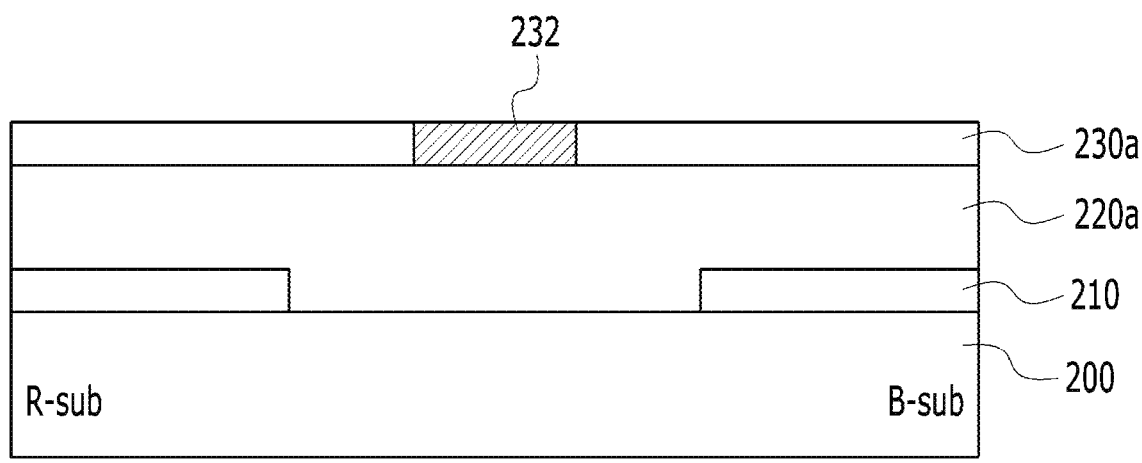

Subsequently, as illustrated in FIG. 10C, after a second bank layer 230a is formed, the second bank layer 230a is flattened to the height of the metal pattern 232. With this process, the second bank layer 230a attains the same height as the metal pattern 232. The flattened second bank layer 230a may adjoin the metal pattern 232 in the non-emission portion.

Figure 10D:
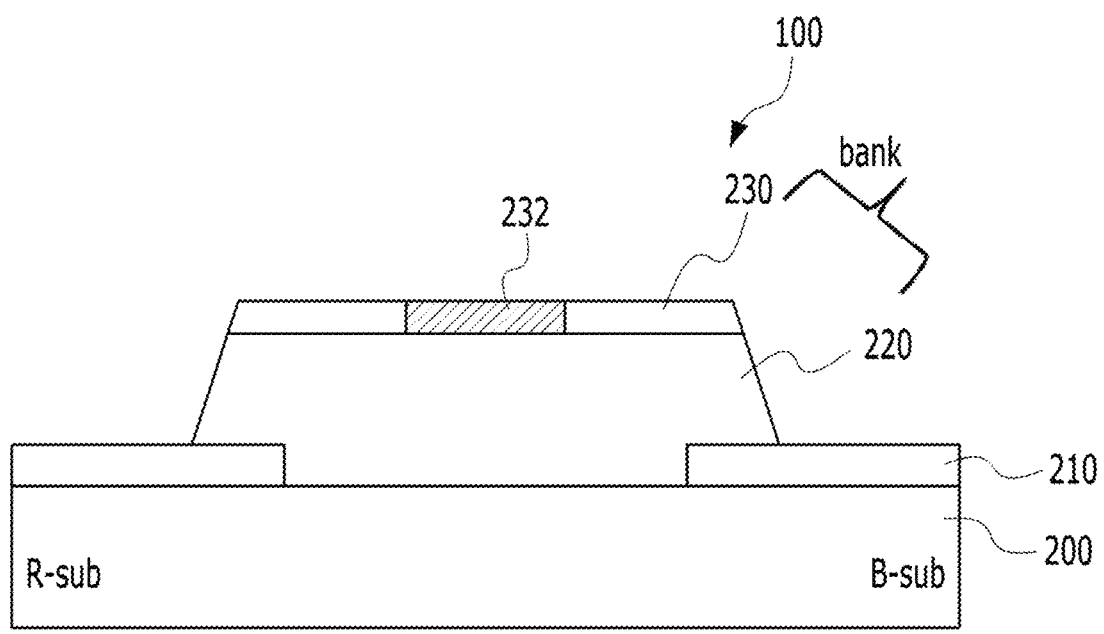

As illustrated in FIG. 10D, the second bank layer 230a and the first bank layer 220a are patterned so as to remain in the non-emission portion, whereby the bank including the patterned first and second bank layers 220 and 230 is formed.

Figure 10E:
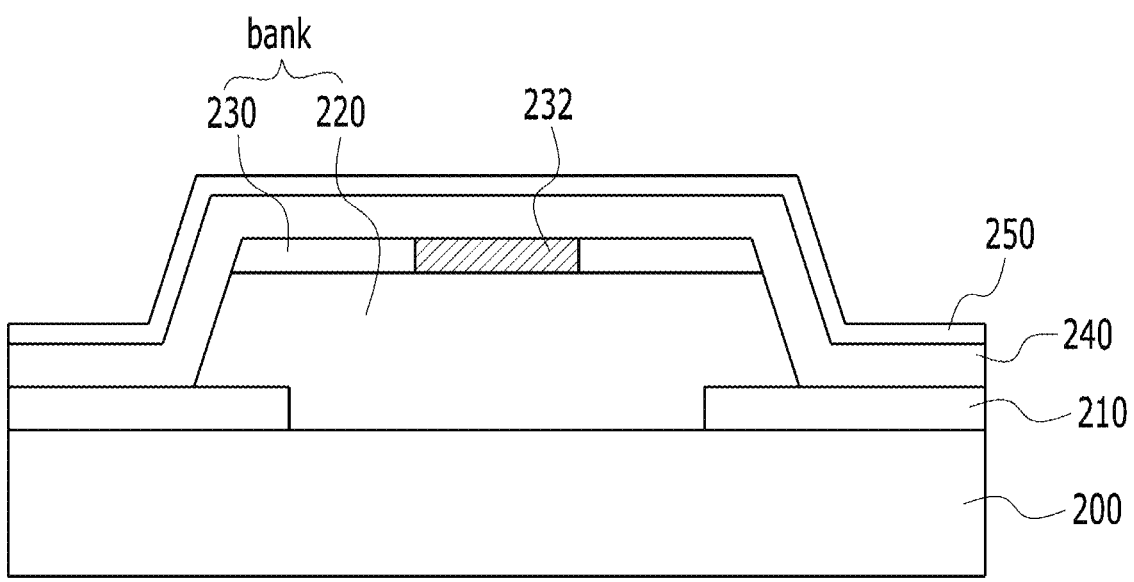

Subsequently, as illustrated in FIG. 10E, the organic stack 240 and a second electrode 250 are formed in sequence on all of the sub-pixels including the bank, the metal pattern 232, and the emission portion.

Here, the organic stack, as illustrated in FIG. 8, may be of a single stack type that includes a hole injection layer HIL, a hole transport layer HTL, a light-emitting layer EML, and an electron transport layer ETL, or may be of a multi-stack type that includes a hole injection layer HIL, a first stack, a charge generation layer CGL, and a second stack. In the latter case, the organic stack may include a greater number of stacks than the illustrated two stacks, and the charge generation layer may be provided between the neighboring stacks. For example, the charge generation layer may include an n-type charge generation layer and a p-type charge generation layer.

The organic matter of the organic stack including the hole injection layer HIL may be formed via deposition, and the layers of the stack may be deposited in common on the sub-pixels without using a mask and without distinguishing between areas.

In addition, the second electrode 250 may be formed via deposition.

In the organic light-emitting display device according to the second embodiment of the present invention, which is completed by the above-described method, when the highly conductive organic common layer such as, for example, the hole injection layer, is deposited after the metal pattern is provided on the bank, even if the organic common layer remains on the metal pattern, lateral current leakage due to the organic common layer may be prevented by supplying a ground voltage or a constant voltage to the metal pattern so as to apply a given voltage to the organic common layer.

In addition, this method of preventing lateral current leakage using the metal pattern causes no structural change in the final shape of the bank, thus causing no deterioration in the strength of adhesion to an encapsulation layer caused by bank deformation.

In addition, the organic common layer may be formed via deposition, which enables the prevention of lateral current leakage without an increase in the number of masks.

In addition, since lateral current leakage may be prevented by the metal pattern, unlike a related art method of preventing lateral current leakage by increasing the width of a bank, lateral current leakage due to the organic common layer may be prevented by removing the organic common layer via a structural method or by applying a given potential thereto, which enables a reduction in the width of the bank, thus being advantageous in realizing a high-resolution structure.

Third Embodiment

Figure 11:
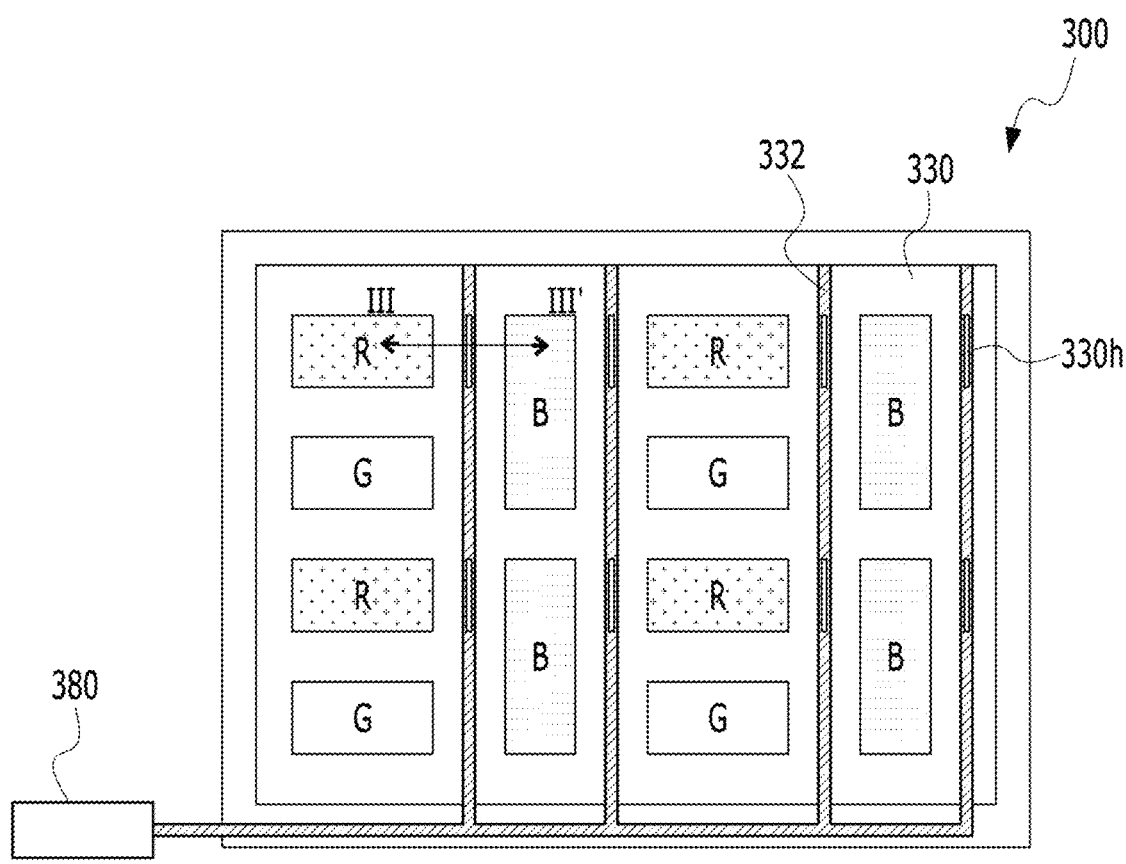
FIG. 11 is a plan view illustrating an organic light-emitting display device according to a third embodiment of the present disclosure.
Figure 12:
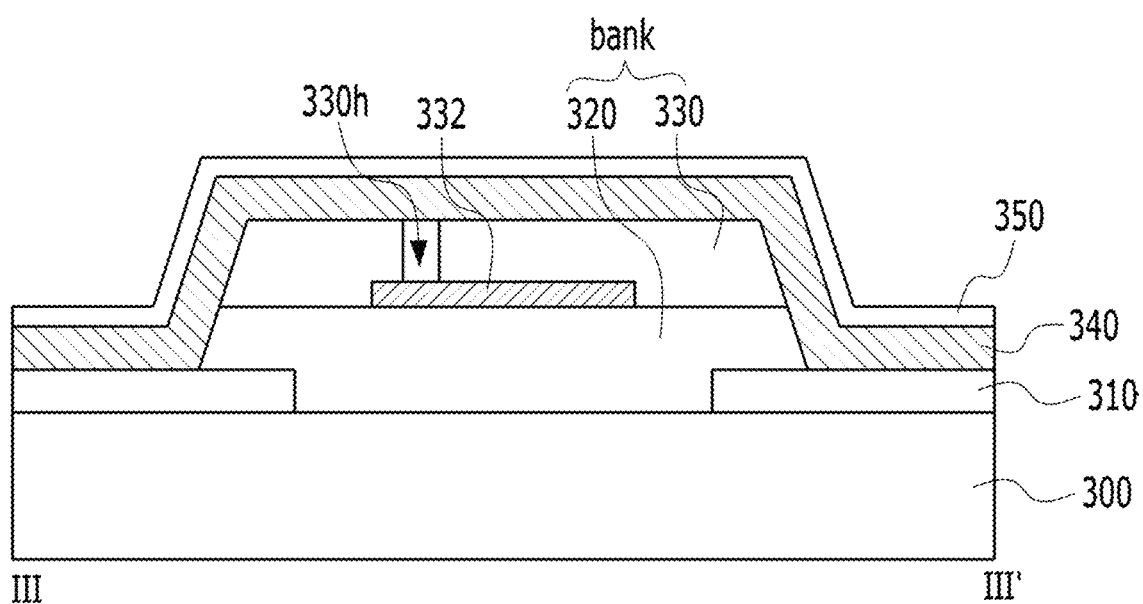
FIG. 12 is a cross-sectional view taken along line III-III' of FIG. 11.

FIG. 11 is a plan view illustrating an organic light-emitting display device according to a third embodiment of the present invention, and FIG. 12 is a cross-sectional view taken along line III-III' of FIG. 11.

The organic light-emitting display device according to the third embodiment of the present invention may achieve the separation of organic matter through a bank hole 330h while preventing a metal pattern 332 from being exposed from a bank.

At this time, the bank includes a first layer 320 and a second layer 330, each of which has a thickness of approximately 1 μm. The metal pattern 332 formed on the surface of the first layer 320 has a thickness ranging from 1000 Å to 3000 Å so as to be sufficiently covered with the second layer 330.

The bank hole 330h has a diameter that is somewhat smaller than the width of the metal pattern 332. The bank hole 330h is discontinuously formed on the metal pattern 332, and has no effect on the maintenance of the pattern in the second layer 330 because of the small diameter thereof. That is, the bank hole 330h is locally formed to have a diameter ranging from approximately 1 μm to 5 μm, and therefore has no effect on the maintenance of the pattern of the bank, which has a width of 10 μm or more.

In addition, the bank hole 330h has a sidewall that is substantially close to vertical. Thus, a hole injection layer HIL, which is firstly deposited, among an organic stack 340, will undergo pattern cutoff at the sidewall of the bank hole 330h even if deposition is performed without a mask. Thereby, the bank hole 330h may achieve disconnection of a highly conductive common layer between sub-pixels.

In addition, through the provision of the bank hole 330h, collection of micro-current and control of the collected current via connection to a ground unit or a constant voltage application unit 380 may be implemented.

Meanwhile, in the structure of the third embodiment, the metal pattern 332 is also connected at one end thereof to the ground unit or the constant voltage application unit 380. Thus, even if a common ground signal is applied to the entire metal pattern 332, thus causing the connection of some common layers, lateral current leakage between sub-pixels may be prevented for the same reason as in the second embodiment.

Meanwhile, the plan view of FIG. 11 illustrates that the metal pattern 332 is formed along opposite sides of the blue sub-pixel. In some cases, a metal pattern may be further provided in the horizontal direction between the red sub-pixel and the green sub-pixel. Alternatively, as in the example of FIG. 2, the red sub-pixel R, the green sub-pixel G, and the blue sub-pixel B may be arranged parallel to one another in a stripe arrangement, and the metal pattern 332 may be formed between the stripe-shaped sub-pixels.

Hereinafter, a method of manufacturing the organic light-emitting display device according to the third embodiment of the present invention will be described.

FIGS. 13A to 13F are process cross-sectional views illustrating a method of manufacturing the organic light-emitting display device according to the third embodiment of the present invention.

Figure 13A:
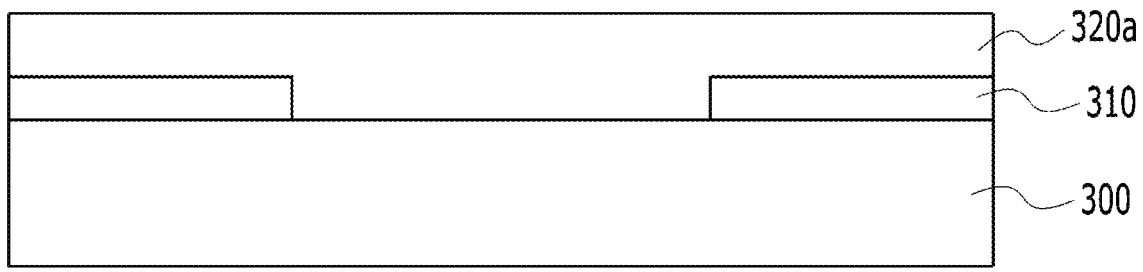
FIGS. 13A to 13F are process cross-sectional views illustrating a method of manufacturing the organic light-emitting display device according to the third embodiment of the present disclosure.

As illustrated in FIG. 13A, a first electrode 310 is formed on each sub-pixel R-sub, G-sub or B-sub of a substrate 300.

The substrate 300 may be a glass substrate or a flexible substrate. Before the first electrode 310 is formed, a thin-film transistor array, which includes a driving thin-film transistor, a switching thin-film transistor, and a capacitor, may be provided under the first electrode 310. The thin-film transistor array will be understood by referring to a known circuit structure of 2T1C or more for each sub-pixel, and thus a detailed description thereof will be omitted.

Here, the first electrode 310 may be formed so as to be connected to one electrode of the driving thin-film transistor. The first electrode 310 may be a transparent electrode or a reflective electrode, may be determined based on the work function and the light-emitting direction, and may be formed in a single layer or in multiple layers.

Subsequently, a first bank layer 320a is formed on the entire surface of the substrate 300 including the first electrodes 310.

Figure 13B:
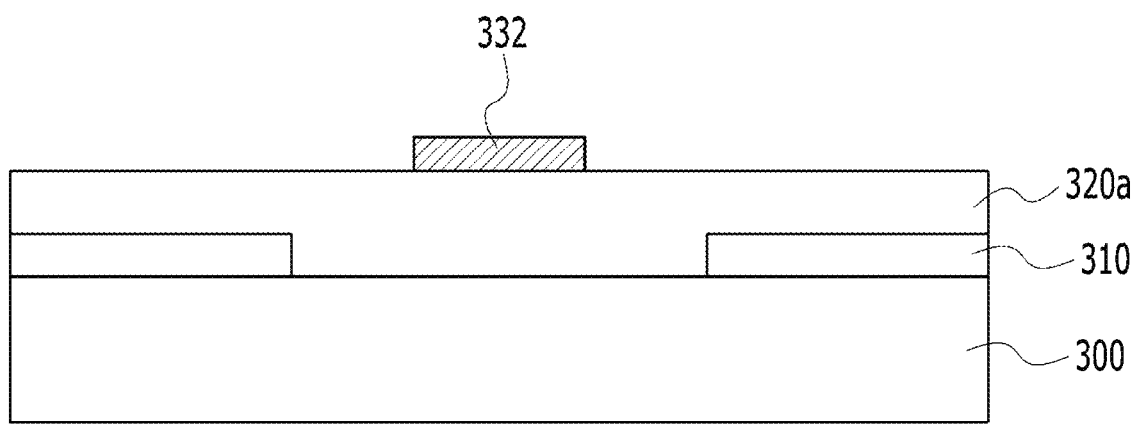

As illustrated in FIG. 13B, the metal pattern 332 is formed between the first electrodes 310 of the adjacent sub-pixels on the portion of the first bank layer 320a corresponding to the non-emission portion. That is, the metal pattern 332 is located between the first electrodes 310 of the adjacent sub-pixels in a plan view.

Here, the metal pattern 332 is elongated in a given direction of the substrate 300 and is connected at one side thereof to the ground unit or the constant voltage application unit 380 as illustrated in FIG. 11.

That is, the metal pattern 332 may extend in a given direction across the sub-pixels arranged on the substrate 300, and may extend to the edge (pad portion) of the substrate 300. FIG. 11 illustrates the metal pattern 332 having a vertically elongated shape (in other words, a shape elongated along a vertical direction (e.g., column direction of the display device)). In addition, multiple metal patterns 332 may be interconnected at the ends thereof so as to share a voltage applied from the ground unit or the constant voltage application unit 380.

Figure 13C:
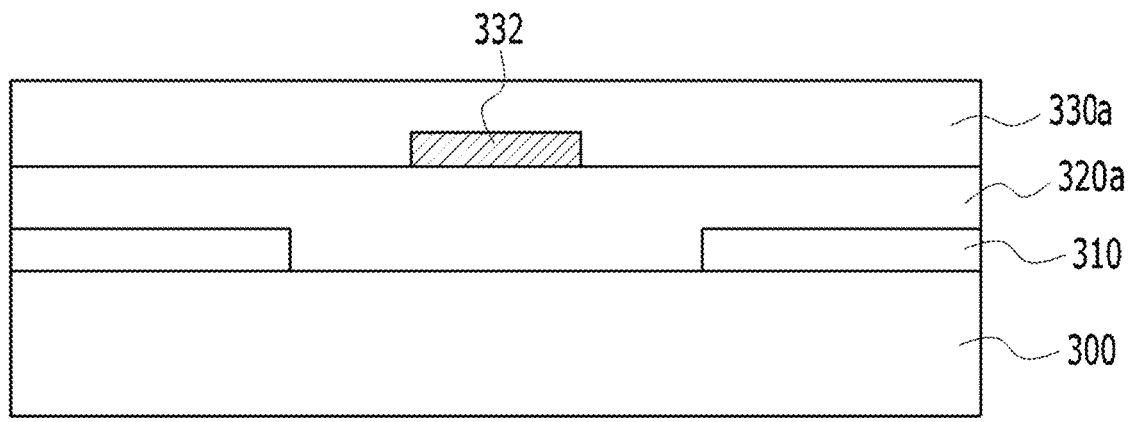

Subsequently, as illustrated in FIG. 13C, a second bank layer 330a is formed to a thickness that is similar or equal to that of the first bank layer 320a, so as to cover the metal pattern 332.

Figure 13D:
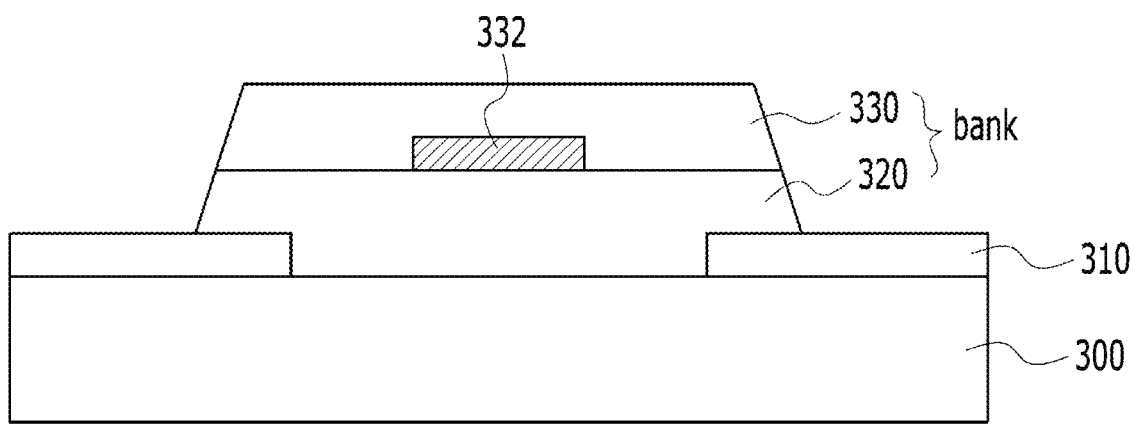

Subsequently, as illustrated in FIG. 13D, the second bank layer 330a and the first bank layer 320a are patterned so as to remain in the non-emission portion, whereby the bank including the patterned first and second bank layers 320 and 330 is formed.

Figure 13E:
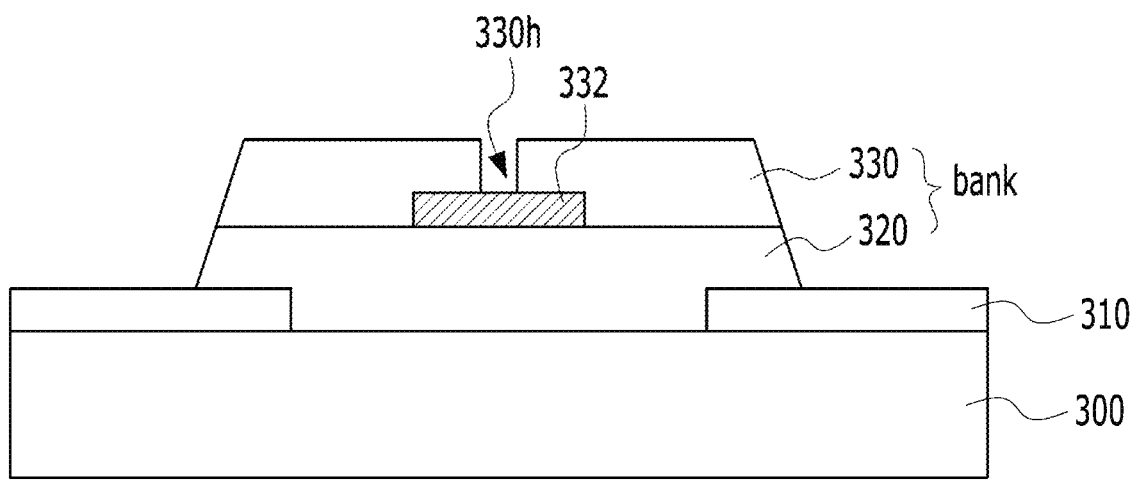

Subsequently, as illustrated in FIG. 13E, the second bank layer 330 is selectively removed to form the bank hole 330h, which exposes a portion of the metal pattern 332. In the cross-sectional view, the bank hole 330h may be located at a center of the metal pattern 332 (as shown in FIG. 13E) or may be located off-center (as shown in FIG. 13F).

Figure 13F:
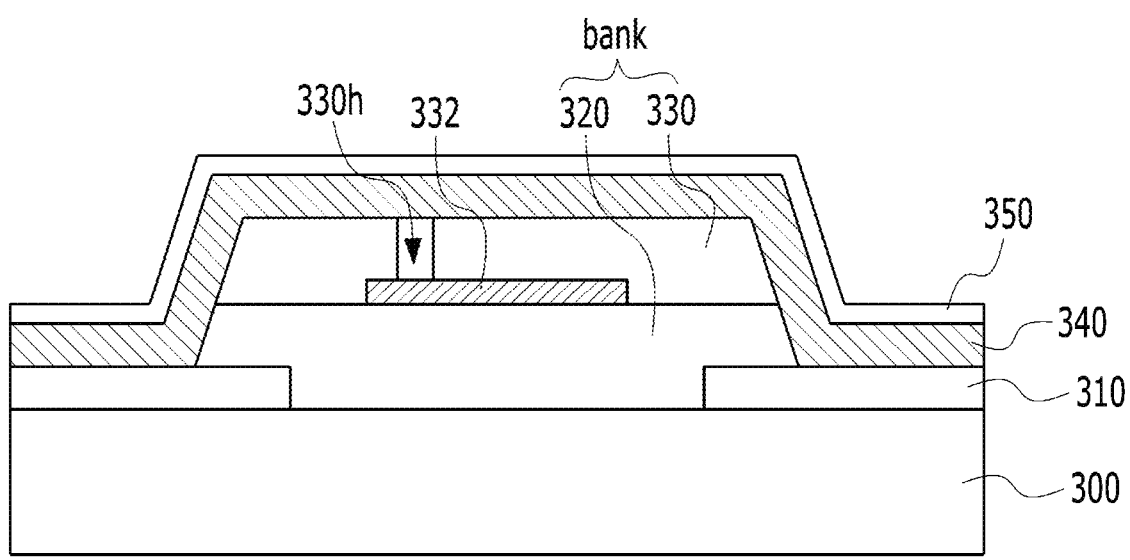

Subsequently, as illustrated in FIG. 13F, the organic stack 340 and a second electrode 350 are formed in sequence on the bank having the bank hole 330h and the first electrode 310 in the emission portion.

Here, the organic stack 340, as illustrated in FIG. 8, may be of a single stack type that includes a hole injection layer HIL, a hole transport layer HTL, a light-emitting layer EML, and an electron transport layer ETL, or may be of a multi-stack type that includes a hole injection layer HIL, a first stack, a charge generation layer CGL, and a second stack. In the latter case, the organic stack may include a greater number of stacks than the illustrated two stacks, and the charge generation layer may be provided between the neighboring stacks. For example, the charge generation layer may include an n-type charge generation layer and a p-type charge generation layer.

The organic matter of the organic stack including the hole injection layer HIL may be formed via deposition, and the layers of the stack may be deposited in common on the sub-pixels without using a mask and without distinguishing between areas.

Here, a portion of the organic stack 340 may also be deposited on the metal pattern 340.

In addition, the second electrode 350 may be formed via deposition.

In the organic light-emitting display device according to the second embodiment of the present invention, which is completed by the above-described method, when the highly conductive organic common layer such as, for example, the hole injection layer, is deposited after the metal pattern is provided on the bank, even if the organic common layer remains on the metal pattern, lateral current leakage due to the organic common layer may be prevented by applying a ground voltage or a constant voltage to the metal pattern so as to apply a given voltage to the organic common layer.

In addition, a portion of the organic stack 340 is deposited inside the bank hole 330h, and micro-current is collected in the bank hole 330h, the micro-current may be controlled by the ground unit or the constant voltage application unit 380 connected to the metal pattern 332. Thereby, lateral current leakage may be prevented.

In addition, this method of preventing lateral current leakage using the metal pattern causes no structural change in the final shape of the bank, thus causing no deterioration in the strength of adhesion to an encapsulation layer caused by bank deformation.

In addition, the organic common layer may be formed via deposition, which enables the prevention of lateral current leakage without an increase in the number of masks.

In addition, since lateral current leakage may be prevented by the metal pattern, unlike a related art method of preventing lateral current leakage by increasing the width of a bank, lateral current leakage due to the organic common layer may be prevented by removing the organic common layer via a structural method or by applying a given potential thereto, which enables a reduction in the width of the bank, thus being advantageous in realizing a high-resolution structure.

Next, variation in current for each electrode will be described with respect to the case where the ground voltage or the constant voltage is applied via the metal pattern as in the organic light-emitting display devices of the second embodiment and the third embodiment of the present invention and the case of a comparative example having no metal pattern.

In the following experiment, variation in the current of the second electrode of an adjacent sub-pixel was measured while a driving voltage was applied to a blue sub-pixel. The case where no variation in current occurs is not illustrated in the graph of the results.

In the graphs, "Anode" is the first electrode, "Cathode" is the second electrode, each "B" is the blue sub-pixel, and "R" are red sub-pixels adjacent to the blue sub-pixel.

Figure 14A:
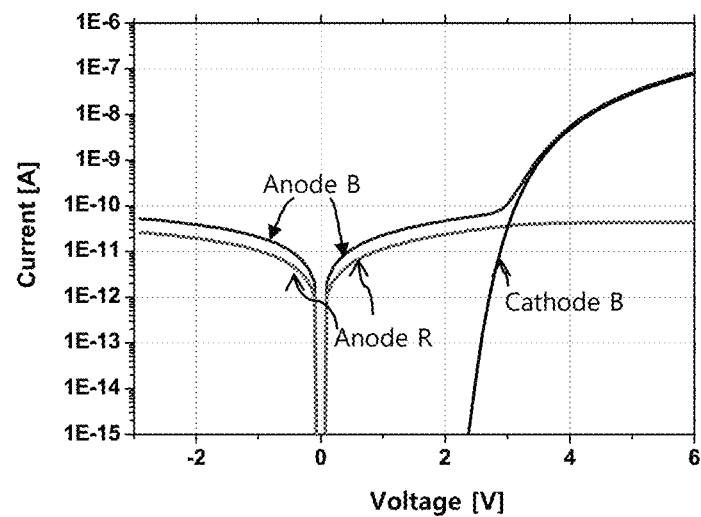
FIGS. 14A and 14B are graphs illustrating the measurement of current of each electrode in the case where zero voltage is applied to a first electrode (anode) of a red sub-pixel adjacent to a blue sub-pixel and in the case where the first electrode is in a floating state with respect to an organic light-emitting display device according to a comparative example.
Figure 14B:
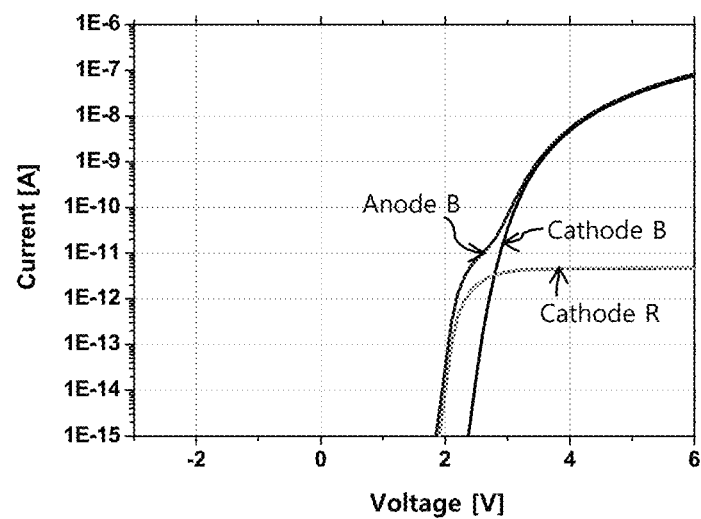

FIGS. 14A and 14B are graphs illustrating the measurement of current of each electrode in the case where zero voltage is applied to the first electrode (anode) of red sub-pixels adjacent to a blue sub-pixel and in the case where the first electrode of the red sub-pixels is in a floating state with respect to an organic light-emitting display device according to a comparative example.

With regard to the comparative example, FIG. 14A illustrates the case where the first electrodes (Anode R) of the respective adjacent red sub-pixels are respectively biased to 0V, and FIG. 14B illustrates the case where the first electrodes of the red sub-pixels are in a floating state.

Considering variation in the current of the second electrodes (Cathode B, and Cathode R) of the blue sub-pixel and the adjacent red sub-pixels, as illustrated in FIG. 14A of the comparative example, when a bias voltage of 0V is applied to the first electrodes of the red sub-pixels, variation in current is observed only in the second electrode of the blue sub-pixel to which a driving voltage is applied.

On the other hand, as illustrated in FIG. 14B of the comparative example, when the first electrodes of the red sub-pixels are in a floating state, variation in current occurs in the second electrode (Cathode R) of the red sub-pixel adjacent to the blue sub-pixel when the driving voltage to the first electrode (anode) B is applied around 2V.

FIGS. 15A and 15B are graphs illustrating the measurement of current of each electrode in the case where zero voltage is applied to the first electrode (anode) of a red sub-pixel adjacent to a blue sub-pixel and in the case where the first electrode is in a floating state with respect to the organic light-emitting display devices according to the second embodiment and the third embodiment of the present invention.

As illustrated in FIGS. 15A and 15B, in the organic light-emitting display device of the present invention, regardless of whether the first electrodes (Anode R) of the red sub-pixels are in a floating state or receive a bias voltage, since laterally leaked current moves to the metal pattern, the first electrode (Anode R) of the red sub-pixel adjacent to the blue sub-pixel, which is driven, has a fixed current value of 1E-10A, and no current is observed in the second electrodes (Cathode R) of the red sub-pixels.

That is, since no current vertically flows in the organic stack according to the voltage state of the first electrode of the red sub-pixel adjacent to the blue sub-pixel, which is driven, the second electrodes (Cathode R) of the adjacent red sub-pixels have no current value. This indicates that lateral current leakage is prevented by the structure according to the second and third embodiments of the present invention.

As is apparent from the above description, an organic light-emitting display device and a method of manufacturing the same according to the present invention have the following effects.

First, the organic light-emitting display device of the present invention includes a metal pattern provided on a bank. As such, even if a highly conductive organic common layer such as, for example, a hole injection layer, is deposited, the organic common layer may be removed by applying current to the metal pattern. Thereby, the structural separation of the organic common layer, which may cause lateral current leakage, may be realized.

Second, in the organic light-emitting display device of the present invention in which the metal pattern is provided on the bank, even if the highly conductive organic common layer such as, for example, a hole injection layer, remains on the metal pattern after current is applied to the metal pattern, current leakage between neighboring sub-pixels may be prevented when a ground voltage or a constant voltage is applied to the metal pattern.

Third, such a method of preventing lateral current leakage using the metal pattern causes no structural change in the final shape of the bank, and therefore, causes no deterioration in the strength of adhesion to an encapsulation layer due to bank deformation.

Fourth, since the organic common layer is formed via deposition, the prevention of lateral current leakage may be realized without an increase in the number of masks.

Fifth, since the prevention of lateral current leakage using the metal pattern is realized by removing the organic common layer or by applying a given potential, unlike a related art method of preventing lateral current leakage by increasing the width of a bank, a reduction in the width of the bank may be achieved, which is advantageous in realizing a high-resolution structure.

It will be apparent to those skilled in the art that various modifications and variations can be made in the organic light-emitting display device and method of manufacturing the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display device, comprising:
   a substrate including a plurality of sub-pixels each having an emission portion and a non- emission portion surrounding the emission portion;
   a plurality of first electrodes, each of the first electrodes on the emission portion of a respective one of the sub-pixels;
   a bank on the non-emission portions of the sub-pixels;
   a metal pattern on a predetermined portion of the bank, the metal pattern being connected to a ground unit or a constant voltage application unit;
   an organic stack on the bank, the metal pattern, and each of the emission portions, respectively; and
   a second electrode on the organic stack,
   wherein the bank includes first and second layers,
   wherein the metal pattern is on a portion of an upper surface of the first layer, and
   wherein the second layer covers the metal pattern and has a bank hole configured to expose a portion of the metal pattern.

2. The device according to claim 1, wherein the metal pattern is located on an upper surface of the bank.

3. The device according to claim 2, wherein the organic stack located on an upper surface of the metal pattern has a smaller thickness than that of the organic stack located on the emission portion.

4. The device according to claim 2, wherein the organic stack located on an upper surface of the metal pattern has a smaller thickness than that of the organic stack on the bank having no metal pattern.

5. The device according to claim 2, wherein the organic stack includes a hole injection layer, a hole transport layer, a light-emitting layer, and an electron transport layer, and
   wherein the hole injection layer, the hole transport layer, and the electron transport layer are provided in common on all of the sub-pixels.

6. The device according to claim 5, wherein the metal pattern is in direct contact with the hole transport layer of the organic stack.

7. The device according to claim 2, wherein the organic stack includes a hole injection layer, two or more stacks each including a hole transport layer, a light- emitting layer, and an electron transport layer, and at least one charge generation layer between neighboring ones of the two or more stacks, and
   wherein the hole injection layer, the stacks, and the charge generation layer are provided in common on all of the sub-pixels.

8. The device according to claim 2, wherein the metal pattern is elongated in one direction of the substrate and is connected to a current application unit on an edge of the substrate.

9. The device according to claim 1, wherein the metal pattern is elongated in one direction of the substrate and is connected to the ground unit or the constant voltage application unit on an edge of the substrate.

10. The device according to claim 1, wherein the second layer is formed around the metal pattern and has the same height as the metal pattern.

11. The device according to claim 1, wherein the second layer has a greater height than that of the metal pattern.

12. The device according to claim 11, wherein the bank hole is discontinuously located on the metal pattern.

13. The device according to claim 1, wherein the organic stack at a location on the metal pattern and the organic stack at a location on the emission portion have the same structure.

14. A method of manufacturing an organic light-emitting display device, the method comprising:
   preparing a substrate including a plurality of sub-pixels each having an emission portion and a non-emission portion surrounding the emission portion;
   providing a plurality of first electrodes, each of the first electrodes on the emission portion of a respective one of the sub-pixels;
   providing a bank on the non-emission portions of the sub-pixels;
   providing a metal pattern on a predetermined portion of the bank, the metal pattern being connected to a ground unit or a constant voltage application unit;
   depositing a first organic layer on the bank, the metal pattern, and each of the emission portions, respectively;
   removing the first organic layer on the metal pattern by supplying current to the metal pattern;
   depositing a second organic layer on the bank, the exposed metal pattern, and each of the emission portions, respectively; and
   providing a second electrode on the second organic layer, wherein the providing the bank includes:
   forming a first bank layer on each of the non-emission portions of the sub-pixels,
   forming a second bank layer to cover the metal pattern, and
   forming a bank hole configured to expose a portion of the metal pattern.

15. The method according to claim 14, wherein the removing is performed by applying current to opposite ends of the metal pattern.

16. A method of manufacturing an organic light-emitting display device, the method comprising:
   preparing a substrate including a plurality of sub-pixels each having an emission portion and a non-emission portion surrounding the emission portion;
   providing a first electrodes on the emission portion of a respective one of the sub-pixels;
   providing a first bank layer on each of the non-emission portions of the sub-pixels;
   providing a metal pattern on a predetermined portion of the first bank layer, the metal pattern being connected to a ground unit or a constant voltage application unit;
   providing a second bank layer on the first bank layer so as to form a bank, wherein the providing the second bank layer includes:
   forming the second bank layer to cover the metal pattern, and
   forming a bank hole configured to expose a portion of the metal pattern;
   depositing an organic stack on the bank and each of the emission portions, respectively; and
   providing a second electrode on the organic stack.

17. The method according to claim 16, wherein the providing the second bank layer further includes flattening the second bank layer so that the second bank layer remains only around the metal pattern so as to have the same height as the metal pattern on the first bank layer.

18. The method according to claim 16, wherein, in the depositing, the organic stack is on the emission portions, on a top of the second bank layer, and on a top of the metal pattern.

* * * * *